United States Patent
Herrmann

(10) Patent No.: US 8,461,601 B2
(45) Date of Patent: Jun. 11, 2013

(54) METHOD FOR PRODUCING A PLURALITY OF OPTOELECTRONIC DEVICES, AND OPTOELECTRONIC DEVICE

(75) Inventor: Siegfried Herrmann, Neukirchen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 261 days.

(21) Appl. No.: 12/667,199

(22) PCT Filed: Jun. 19, 2008

(86) PCT No.: PCT/DE2008/001008
§ 371 (c)(1),
(2), (4) Date: Jun. 23, 2010

(87) PCT Pub. No.: WO2009/003442
PCT Pub. Date: Jan. 8, 2009

(65) Prior Publication Data
US 2010/0276706 A1   Nov. 4, 2010

(30) Foreign Application Priority Data
Jun. 29, 2007  (DE) .......................... 10 2007 030 129

(51) Int. Cl.
*H01L 29/18* (2006.01)
*H01L 33/00* (2010.01)

(52) U.S. Cl.
USPC ...... 257/88; 257/E33.056; 257/690; 257/692; 257/666; 438/458; 438/113; 438/455; 438/460

(58) Field of Classification Search
USPC .... 257/88, 690, 692, 666, E33.056; 438/458, 438/113, 455, 460
See application file for complete search history.

(56) References Cited

U.S. PATENT DOCUMENTS
6,060,729 A   5/2000  Suzuki et al.
6,066,861 A   5/2000  Höhn et al.
(Continued)

FOREIGN PATENT DOCUMENTS
DE   30 09 985    9/1981
DE   198 54 414   5/1999
(Continued)

OTHER PUBLICATIONS

English Translation of an Office Action issued on Aug. 7, 2012 in the corresponding Japanese Patent Application No. 2010-513642.

*Primary Examiner* — Telly Green
(74) *Attorney, Agent, or Firm* — Cozen O'Connor

(57) ABSTRACT

A method for producing a plurality of optoelectronic devices is specified, comprising the following steps: providing a connection carrier assemblage having a plurality of device regions, wherein at least one electrical connection region is provided in each of the device regions, providing a semiconductor body carrier, on which a plurality of separate semiconductor bodies connected to the semiconductor body carrier are arranged, wherein the semiconductor bodies each have a semiconductor layer sequence having an active region, arranging the connection carrier assemblage and the semiconductor body carrier relative to one another in such a way that the semiconductor bodies face the device regions, mechanically connecting a plurality of semiconductor bodies to the connection carrier assemblage in a mounting region of a device region assigned to the respective semiconductor body, electrically conductively connecting the respective semiconductor body to the connection region of the device region assigned to the semiconductor body, and separating from the semiconductor body carrier the semiconductor bodies that are to be connected or are connected to the connection carrier assemblage, and dividing the connection carrier assemblage into a plurality of separate optoelectronic devices each having a connection carrier, which has the device region, and a semiconductor body arranged on the connection carrier and electrically conductively connected to the connection region.

17 Claims, 11 Drawing Sheets

U.S. PATENT DOCUMENTS

| | | |
|---|---|---|
| 6,410,940 B1 | 6/2002 | Jiang et al. |
| 6,818,531 B1 | 11/2004 | Yoo et al. |
| 6,956,246 B1 | 10/2005 | Epler et al. |
| 7,329,587 B2 | 2/2008 | Bruederl et al. |
| 7,510,888 B2 | 3/2009 | Guenther et al. |
| 2002/0117684 A1* | 8/2002 | Kurokawa et al. ............ 257/197 |
| 2004/0065953 A1* | 4/2004 | Kato ............................ 257/734 |
| 2006/0006404 A1 | 1/2006 | Ibbetson et al. |
| 2006/0231853 A1 | 10/2006 | Tanaka et al. |
| 2007/0096130 A1 | 5/2007 | Schiaffino et al. |
| 2007/0114352 A1* | 5/2007 | Cruz et al. ................ 248/316.7 |
| 2007/0120129 A1* | 5/2007 | DenBaars et al. .............. 257/79 |
| 2007/0126016 A1* | 6/2007 | Chen et al. ..................... 257/96 |
| 2007/0190290 A1 | 8/2007 | Gunther et al. |
| 2008/0087902 A1* | 4/2008 | Lee et al. ........................ 257/88 |
| 2009/0108467 A1* | 4/2009 | Otremba ....................... 257/777 |
| 2009/0186431 A1 | 7/2009 | Tanaka et al. |
| 2009/0267085 A1* | 10/2009 | Lee et al. ........................ 257/88 |

FOREIGN PATENT DOCUMENTS

| | | |
|---|---|---|
| DE | 100 17 336 | 10/2001 |
| DE | 10 2004 030 603 | 2/2005 |
| DE | 103 53 679 | 6/2005 |
| DE | 10 2004 021 233 | 12/2005 |
| DE | 10 2007 004 301 | 2/2008 |
| EP | 1 662 587 | 10/2005 |
| JP | 2002-344028 | 11/2002 |
| JP | 2003-007911 | 1/2003 |
| JP | 2004-111675 | 4/2004 |
| JP | 2005-039264 | 2/2005 |
| JP | 2006-140398 | 6/2006 |
| JP | 2006-278766 | 10/2006 |
| JP | 2008-505508 | 2/2008 |
| TW | 2005 22393 | 1/2006 |
| WO | WO 98/12757 | 3/1998 |
| WO | WO 2005/029599 | 3/2005 |
| WO | WO 2007/016908 | 2/2007 |

* cited by examiner

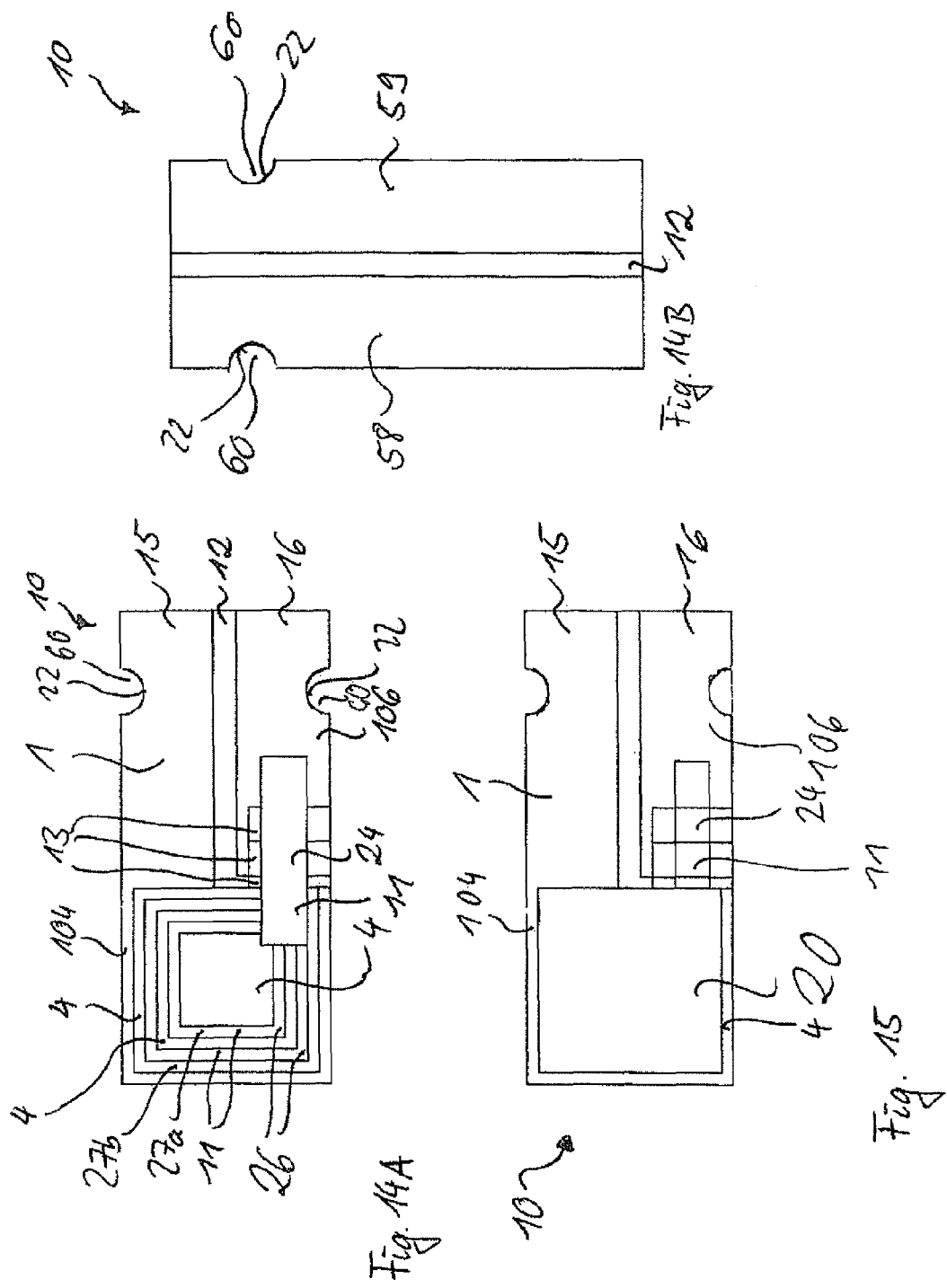

METHOD FOR PRODUCING A PLURALITY OF OPTOELECTRONIC DEVICES, AND OPTOELECTRONIC DEVICE

RELATED APPLICATIONS

This is a U.S. national stage of application No. PCT/DE2008/001008, filed on Jun. 19, 2008, and claims the priority of German application No. 10 2007 030 129.6 filed on Jun. 29, 2007, the entire content of which is hereby incorporated by reference.

FIELD OF THE INVENTION

The present invention relates to a method for producing a plurality of optoelectronic devices, and to an optoelectronic device.

BACKGROUND OF THE INVENTION

The production of optoelectronic devices which, after production, are intended to be fixed and electrically contact-connected on an electrical conductor carrier, such as a printed circuit board, for example, often necessitates a series of individual processing steps that have to be carried out individually at each device. By way of example, optoelectronic semiconductor chips, by means of a so-called pick and place method, are individually introduced into housings for the devices respectively to be produced and are electrically conductively connected in each case individually to connection conductors of the housing. However, individual processing steps, that is to say steps which are carried out separately for each device, are cost-intensive and complex in comparison with processing steps which can be carried out simultaneously for a multiplicity of devices.

SUMMARY OF THE INVENTION

It is an object of the present invention to specify a simplified method for producing a plurality of optoelectronic devices, and also an optoelectronic device which can be produced in a simplified manner.

In a method according to an embodiment of the invention for producing a plurality of optoelectronic devices, the first step involves providing a connection carrier assemblage having a plurality of device regions, wherein at least one electrical connection region is provided in each of the device regions. Furthermore, a semiconductor body carrier is provided, on which a plurality of separate semiconductor bodies connected to the semiconductor body carrier are arranged, wherein the semiconductor bodies each have a semiconductor layer sequence having an active region.

The connection carrier assemblage and the semiconductor body carrier are thereupon arranged relative to one another in such a way that the semiconductor bodies face the device regions. Preferably, the connection carrier assemblage and the semiconductor body carrier are arranged in such a way, in particular arranged with respect to one another in such a way, that semiconductor bodies come into mechanical contact with the connection carrier assemblage. Semiconductor bodies can in particular bear on the connection carrier assemblage.

Afterward, a plurality of semiconductor bodies are mechanically connected to the connection carrier assemblage in a mounting region of a device region assigned to the respective semiconductor body. The respective semiconductor body is electrically conductively connected to the connection region of the device region assigned to the semiconductor body. The semiconductor bodies that are to be connected or have already been connected, in particular electrically and/or mechanically to the connection carrier assemblage are separated from the semiconductor body carrier. Therefore, the process of separating the semiconductor bodies from the semiconductor body carrier can be effected before or after the process of electrically and/or mechanically connecting the respective semiconductor body to the connection carrier assemblage.

The connection carrier assemblage is thereupon divided into a plurality of separate optoelectronic devices, wherein the devices each have a connection carrier, which has the device region, and a semiconductor body arranged on the connection carrier and electrically conductively connected to the connection region.

Such a method has the advantage that the electrically conductive connection and the mechanical connection of semiconductor bodies to a connection region of a connection carrier can be effected in the assemblage. The electrical and mechanical connection of the semiconductor bodies can accordingly be carried out in one process step simultaneously at a plurality of semiconductor bodies. Individual processing steps, for example a pick and place process or a separate wire bonding connection, i.e. a wire bonding connection to be implemented individually for each semiconductor body, can be reduced or avoided.

Expediently, semiconductor bodies are separated from the semiconductor body carrier and connected to the connection carrier assemblage in the mounting region, which semiconductor bodies extend over the mounting region of the respective device region of the connection carrier assemblage.

The connection carrier assemblage and the distribution of the semiconductor bodies on the semiconductor body carrier are preferably coordinated with one another in such a way that when the connection carrier assemblage and the semiconductor body carrier are arranged relative to one another in a predetermined manner, a semiconductor body, preferably precisely one semiconductor body, extends over a mounting region assigned to this semiconductor body.

Preferably, semiconductor bodies which do not extend over a mounting region of the connection carrier assemblage remain on the semiconductor body carrier. Therefore, semiconductor bodies which extend over mounting regions of the connection carrier assemblage can be separated selectively from the semiconductor body carrier, whereas semiconductor bodies which do not extend over mounting regions can remain on the semiconductor body carrier. This has the advantage that the arrangement of the semiconductor bodies on the semiconductor body carrier does not have to be adapted to the arrangement of the mounting regions, or vice versa.

For the production of the plurality of devices, preferably only a portion of the semiconductor bodies arranged on the semiconductor body carrier is separated from the semiconductor body carrier and connected to the connection carrier assemblage.

In one preferred configuration, the semiconductor bodies are separated from the semiconductor body carrier by means of electromagnetic radiation, in particular laser radiation. A laser separation method is particularly suitable for selectively separating individual semiconductor bodies from the semiconductor body carrier. Semiconductor bodies that are to be separated can be locally irradiated by a laser. Non-irradiated semiconductor bodies remain on the semiconductor body carrier.

In one preferred configuration, the semiconductor bodies, before being provided, are arranged and fixed on the semiconductor body carrier in such a way that the distribution of the semiconductor bodies on the semiconductor body carrier corresponds to the distribution of the mounting regions of the connection carrier assemblage. To put it another way, the semiconductor bodies are arranged on the semiconductor body carrier in such a way that the semiconductor bodies, preferably all the semiconductor bodies, extend over a mounting region upon the arrangement of the connection carrier assemblage and semiconductor body carrier relative to one another. In this case, all the semiconductor bodies can be separated from the semiconductor body carrier and can be connected to the connection carrier assemblage.

In a further preferred configuration, the connection carrier assemblage is a connection carrier wafer. For this purpose, the connection carrier assemblage is formed in planar fashion, in particular. Device regions can be distributed over the connection carrier assemblage in planar fashion, for example in matrix-like fashion.

In a further preferred configuration, the semiconductor body carrier with the semiconductor bodies arranged thereon is a semiconductor wafer. The semiconductor bodies can be distributed over the semiconductor body carrier in planar fashion, for example in matrix-like fashion.

In a further preferred configuration, the semiconductor bodies are grown epitaxially. Furthermore, a growth substrate on which the semiconductor bodies were grown is preferably removed from the semiconductor bodies. The semiconductor body carrier can comprise the growth substrate. If the semiconductor body is separated from the growth substrate, then the semiconductor body expediently consists of epitaxially grown layers. The process of separating the semiconductor bodies from the growth substrate can be effected after the process of connecting the semiconductor bodies to the connection carrier assemblage. By means of the method, pure epitaxial layers, in particular, can be transferred directly onto a connection carrier assemblage. A layer that stabilizes the epitaxial layers, such as, for example, a chip substrate in the case of conventional semiconductor chips which are mounted in a housing in the context of the pick and place method, is not necessary. The device height can thus be reduced.

In a further preferred configuration, a mirror layer is arranged on the semiconductor bodies. The mirror layer can contain a metal or a metal compound or consist thereof. The mirror layer is preferably deposited on the semiconductor bodies. The semiconductor bodies can be provided on the semiconductor body carrier with mirror layer arranged on the semiconductor bodies. The mirror layer can be arranged on that side of the semiconductor body which faces the connection carrier assemblage, or between the semiconductor body and the semiconductor body carrier.

In a further preferred configuration, the active region is suitable and in particular provided for generating radiation, preferably visible radiation. The mirror layer is expediently embodied such that it is reflective to the radiation to be generated in the active region.

In a further preferred configuration, after the semiconductor bodies have been connected to the connection carrier assemblage and/or after the semiconductor bodies have been separated from the semiconductor body carrier, a further process step is carried out at the semiconductor bodies. This process step is preferably carried out before the connection carrier assemblage is divided into optoelectronic devices. By way of example, a coupling-out structure can be formed on or in the semiconductor bodies. The respective semiconductor body, in particular a radiation passage area of the semiconductor body, for example for coupling out radiation from the semiconductor body, can be roughened, for example, for a coupling-out structure. Furthermore, a passivation layer can be applied to the respective semiconductor body.

In a further preferred configuration, the respective connection region has the mounting region and a connection conductor region, e.g. a connection conductor layer. The respective semiconductor body can therefore be mounted on the connection region.

Preferably, the mounting region rises above the connection conductor region. In the case where a semiconductor body bears on the mounting region, the elevation makes it possible to avoid a situation in which a semiconductor body that is adjacent to the semiconductor body and is arranged on the semiconductor body carrier comes into mechanical contact with the connection region. The selective separation of a semiconductor body arranged above the mounting region from the semiconductor body carrier is thus facilitated.

The mounting region can be formed for example by a fixing layer, e.g. an adhesive layer or solder layer. If the connection region has the mounting region, then the fixing layer is preferably embodied such that it is electrically conductive. The fixing layer can be arranged in regions on a layer for the connection region, e.g. a connection conductor layer. The fixing layer can be formed for example as a solder layer or an adhesive layer formed in electrically conductive fashion.

In a further preferred configuration, a device region has two connection regions electrically insulated from one another. These connection regions can be electrically conductively connected to the semiconductor body on different sides of the active region.

The semiconductor body is preferably embodied as a radiation-emitting semiconductor body, for example as a luminescence diode semiconductor body.

In a further preferred configuration, the connection carrier assemblage has a connection carrier layer, wherein a plurality of device regions are formed on the connection carrier layer. The connection carrier for the respective device is preferably formed in the process of dividing up the connection carrier layer. The connection carrier layer can therefore be singulated for the division of the connection carrier assemblage. A connection carrier is expediently formed from a piece of the connection carrier layer.

In a further preferred configuration, the connection carrier assemblage has a plurality of separate connection carriers arranged on a common auxiliary carrier layer. For dividing the connection carrier assemblage into optoelectronic devices, the auxiliary carrier layer is preferably removed. In contrast to a continuous connection carrier layer, therefore, the connection carrier assemblage can have separate connection carriers which can be held in the assemblage by means of an auxiliary carrier layer. In this case, a connection carrier can correspond to a device region.

In a further preferred configuration, the connection carrier comprises an electrically insulating carrier body and a connection region applied to the carrier body. The connection region can be deposited on the carrier body, for example by vapor deposition or sputtering.

In a further preferred configuration, the connection carrier, in particular the carrier body, contains a ceramic. A ceramic, for example an aluminum nitride ceramic or an aluminum oxide ceramic, can be distinguished by advantageously high thermal conductivity.

In a further preferred configuration, the connection carrier has an electrically conductive metal body or a metal compound body. A connection region can be formed by a surface of the metal compound body. For two connection regions, it is expedient for two separate metal bodies and/or metal compound bodies to be connected to one another and electrically insulated from one another.

In a further preferred configuration, the connection carrier, in particular the carrier body, is embodied or formed as a heat sink. A ceramic, e.g. an aluminum nitride ceramic or aluminum oxide ceramic, or a metal body and/or a metal compound body are particularly suitable for a heat sink on account of the high thermal conductivity of these materials.

In a further preferred configuration, the connection carrier is transmissive to radiation generated in the semiconductor body. Radiation can thus enter into the connection carrier from the semiconductor body and be coupled out from the device via the connection carrier. For this purpose, the connection carrier can contain a glass, for example.

In a further preferred configuration, the connection regions of the connection carrier assemblage are formed by means of lithography. A lithographic method, such as, for example, photolithography, in particular photolithography using a laser for exposing photoresist material, e.g. for a mask structure, is distinguished by the fact that very fine structures can be realized. It is accordingly possible to provide device regions in a manner arranged correspondingly densely in the connection carrier assemblage.

The connection regions can be formed by means of deposition, e.g. sputtering or vapor deposition, on the connection carrier or the connection carrier layer. The connection regions can be galvanically reinforced after the deposition.

In a further preferred configuration, a distance between adjacent semiconductor bodies on the semiconductor body carrier is 40 μm or less, preferably 30 μm or less, particularly preferably 20 μm or less, e.g. 10 μm or less or 5 μm or less. Such small distances between semiconductor bodies on the semiconductor body carrier can be realized since—in contrast to the conventional fabrication of semiconductor chips by sawing a semiconductor wafer—the semiconductor body carrier in the present case is preferably not divided up, rather the semiconductor bodies can be (selectively) separated from the semiconductor body carrier and be transferred directly onto the connection carrier assemblage. It is therefore not necessary to provide, for dividing up a semiconductor wafer between the semiconductor bodies, such a large distance that the latter are not damaged in the course of the separation of the semiconductor body carrier.

In a further preferred configuration, the semiconductor bodies, before the semiconductor body carrier is provided, are formed by means of etching, e.g. by means of a plasma etching method, from an, in particular epitaxially grown, semiconductor layer structure. A plasma etching method in combination with a corresponding mask has proved to be particularly suitable for obtaining small distances between adjacent semiconductor bodies (see further above) on the semiconductor body carrier.

In a further preferred configuration, in a device region, a plurality of semiconductor bodies are connected to the connection carrier assemblage. Expediently, each of these semiconductor bodies is assigned a mounting region, preferably each semiconductor body being assigned a separate mounting region, and a connection region of the device region. The semiconductor bodies are preferably arranged alongside one another. Furthermore, an optoelectronic device preferably comprises precisely one device region.

A distance between adjacent semiconductor bodies in the device region can be 40 μm or less, preferably 30 μm or less, particularly preferably 20 μm or less, e.g. 10 μm or less or 5 μm or less. Semiconductor bodies can be transferred into the device region with the distances that they already have on the semiconductor body carrier. The distance that can be obtained between the semiconductor bodies is therefore limited downward essentially only by the resolution of the methods used when forming the semiconductor bodies from a semiconductor layer structure, e.g. a (photo)lithographic method.

An optoelectronic device comprises, in accordance with one embodiment, a semiconductor body comprising a semiconductor layer sequence having an active region.

In one preferred configuration, the device has a connection carrier, on which the semiconductor body is arranged and fixed. Preferably, an electrical connection region is formed on that side of the connection carrier which faces the semiconductor body. The connection region furthermore extends preferably alongside the semiconductor body in a plan view of the connection carrier. The connection region can be arranged alongside the semiconductor body in a plan view of the connection carrier. Furthermore, the connection region is preferably electrically conductively connected to the semiconductor body.

The optoelectronic device is preferably produced in the method described further above, and so features described further above and below for the method can also relate to the optoelectronic device, and vice versa. In this case, a device region of the connection carrier assemblage can correspond to the part of the assemblage which forms the later device.

In one preferred configuration, the device has a planarization layer arranged alongside the semiconductor body on the connection carrier. Expediently, a distance between that side of the planarization layer which is remote from the connection carrier and that side of the semiconductor body which is remote from the connection carrier is less than a distance between that side of the semiconductor body which is remote from the connection carrier and the connection carrier.

For forming the planarization layer, after the semiconductor bodies have been fixed on the connection carrier assemblage, preferably a planarization material is applied between the semiconductor bodies onto the connection carrier assemblage. The planarization material, in particular after being applied to the connection carrier assemblage, is expediently formed in such a way that a planarization layer is arranged alongside the respective semiconductor body. In this case, the planarization layer can extend continuously over the assemblage or be formed in regions alongside the respective semiconductor bodies. The planarization material is preferably a molding compound. The planarization material can be applied in particular as a molding compound, for example applied by spin-coating, and subsequently be solidified. By way of example, a BCB (benzocyclobutene) is suitable as planarization material.

In this case, a part of the planarization material which extends, if appropriate, over that side of the semiconductor bodies which is remote from the mounting regions is expediently removed for the formation of the planarization layer. What can be achieved overall by means of the planarization layer is that that area of the semiconductor body which is remote from the mounting region undergoes transition exactly into that area of the planarization layer which is remote from the connection carrier.

A more extensive planar process implementation during the production of the optoelectronic devices is thus facilitated. Preferably, the (entire) method can be carried out as a planar method.

The planarization material and accordingly also the planarization layer are preferably electrically insulating. Furthermore, the planarization material can be radiation-transmissive to a radiation to be generated in the semiconductor body. Absorption of radiation in the planarization material can thus be avoided.

Preferably, the connection region of the device has a mounting region and a connection conductor region, wherein the semiconductor body is particularly preferably fixed in the mounting region on the connection carrier and in particular is electrically conductively connected to the connection region. The connection region can be arranged in particular in regions between the connection carrier and the semiconductor body.

In a further preferred configuration, after the semiconductor bodies have been fixed on the connection carrier assemblage and in particular still before the connection carrier assemblage is divided, an electrical contact is applied to that side of the respective semiconductor body which is remote from the mounting region.

In a further preferred configuration, the contact is applied to the semiconductor body and the planarization layer. The electrical contact, which is expediently formed for making contact with that side of the semiconductor body which is remote from the connection carrier, can therefore extend over that side of the planarization layer which is remote from the connection carrier. The contact of the respective semiconductor body can be applied by means of deposition, for example by vapor deposition or sputtering, onto the semiconductor body and in particular also the planarization layer.

The respective contact preferably has a current distribution structure. The latter is expediently arranged on that side of the semiconductor body which is remote from the connection carrier. The current distribution structure can be applied to that side of the respective semiconductor body which is remote from the mounting region of the semiconductor body. The current distribution structure preferably extends in large-area fashion over the semiconductor body and can be cut out in regions for the passage of radiation.

The contact can be formed as a contact metallization or contact alloy, for example.

In a further preferred configuration, a contact conductor extends, preferably in layer-like fashion, from that side of the semiconductor body which is remote from the mounting region toward the connection carrier. By means of the contact conductor, that side of the respective semiconductor body which is remote from the mounting region can be electrically conductively connected to an external electrical connection pad for the device. The contact conductor can be electrically conductively connected to the connection region or a further connection region formed on the connection carrier. The contact conductor extends preferably, in particular in contrast to the current distribution structure, over that side of the planarization layer which is remote from the connection carrier.

The contact can comprise the current distribution structure and/or the contact conductor. The contact conductor and the current distribution structure can be applied to the connection carrier assemblage by means of lithography using a common mask. The current distribution structure and the contact conductor can have a continuous layer. The contact, the contact conductor and/or the current distribution structure can be galvanically reinforced after application. The current-carrying capacity of galvanically reinforced contact elements is advantageously increased.

The contact conductor can extend from that side of the planarization layer which is remote from the connection carrier, in particular along the planarization layer, as far as the connection region and in particular be electrically conductively connected to the connection region.

In order to facilitate a guidance of the contact conductor along the planarization layer in the direction of that side of the connection carrier which faces the semiconductor body, the planarization layer can be formed in a suitable manner. By way of example, the planarization layer can run obliquely to the connection carrier on a side remote from the semiconductor body. The contact conductor can extend along the slope. The planarization layer therefore preferably widens from its side remote from the connection carrier in the direction of the connection carrier.

The contact conductor can furthermore extend toward the connection carrier through a cutout in the planarization layer, the latter preferably having said cutout.

For this purpose, the planarization material can be applied to the connection carrier assemblage in correspondingly patterned fashion or the planarization material can be correspondingly patterned, preferably after solidification for the planarization layer, such that the planarization layer is cut out or beveled on the edge side.

In a further preferred configuration, a contact ramp is arranged alongside the semiconductor body and in particular on the connection carrier. The contact ramp can run from the semiconductor body in the direction of that side of the connection carrier which faces the semiconductor body, and can in particular be inclined in this direction. The contact ramp can serve for guiding the contact conductor, which can be guided along the contact ramp. The contact conductor can be electrically conductively connected to that side of the semiconductor body which is remote from the mounting region. By way of example, the contact conductor can be guided along the contact ramp to the connection region or a further connection region of the connection carrier. The contact ramp can be formed in wedge-shaped fashion. The contact ramp can taper proceeding from the connection carrier. The contact ramp can be formed by the planarization layer. Features described further above and below in connection with the planarization layer can therefore also relate to the contact ramp, and vice versa.

It is possible that the contact ramp extends only in regions alongside the semiconductor body. It is possible that the contact ramp extends, preferably only, in a partial region alongside a side area of the semiconductor body. The contact ramp preferably extends over a connection conductor region of the connection region to which the contact conductor is electrically conductively connected.

In a further preferred configuration, the device has two external connection pads arranged on the same side of the connection carrier. The connection pads are electrically conductively connected to the semiconductor body preferably on different sides of the active region. The connection pads are preferably arranged on that side of the connection carrier which is remote from the semiconductor body. The connection pads are expediently provided for forming external electrical contact with the optoelectronic device. By way of example, the connection pads can be soldered to conductors of a conductor carrier, such as a printed circuit board, for example. The device can therefore be embodied in particular as a surface mountable device.

Alternatively or supplementarily, two external connection pads of the device can be arranged on that side of the connection carrier which faces the semiconductor body. The connection pads are electrically conductively connected to the semiconductor body preferably on different sides of the active region. The connection pads can then be electrically conductively connected to a conductor of a conductor carrier for example in each case by means of a bonding wire or an electrically conductive external connection linking layer, for example an electrically conductive film.

Alternatively or supplementarily, two external connection pads can be arranged on different sides of the connection carrier. The connection pads are electrically conductively connected to the semiconductor body preferably on different sides of the active region.

In a further preferred configuration, the semiconductor body has a thickness of 10 μm or less, particularly preferably of 7 μm or less, e.g. of 6 μm or less.

In a further preferred configuration, an extent of the semiconductor body in a plan view of the connection carrier, for example the length and/or the width of the semiconductor body, is 100 μm or less or 50 μm or less, preferably 40 μm or less, particularly preferably 30 μm or less, e.g. 20 μm or less or 10 μm or less.

In a further preferred configuration, a thickness of the connection carrier is 50 μm or less, preferably 40 μm or less, particularly preferably 30 μm or less.

In a further preferred configuration, a height of the device is 80 μm or less, preferably 60 μm or less, particularly preferably 50 μm or less, e.g. 40 μm or less.

By means of the method wherein the semiconductor bodies are transferred to the connection carrier assemblage, it is thus possible to produce very thin devices. Furthermore, it is also possible to realize devices with semiconductor bodies which cannot be inserted into a housing, or can be inserted into a housing only with difficulty, by means of conventional positioning methods such as pick and place processes, for example.

The connection carriers or the device regions can have a predefined size, in particular a predefined distance between two connection regions, wherein different geometries or extents of the semiconductor bodies can be compensated for by means of the contact guidance described further above.

In a further preferred configuration, the optoelectronic device has a plurality of semiconductor bodies each comprising a semiconductor layer sequence having an active region. The semiconductor bodies are preferably arranged and fixed alongside one another on the connection carrier.

Each of the semiconductor bodies is expediently assigned an electrical connection region. The latter is preferably formed on the connection carrier. The semiconductor bodies are furthermore preferably electrically conductively connected to the respectively assigned connection region. In this case, a distance between adjacent semiconductor bodies can be 40 μm or less, preferably 30 μm or less, particularly preferably 20 μm or less, e.g. 10 μm or less or 5 μm or less.

In a further preferred configuration, two semiconductor bodies are electrically conductively connected to a common connection region.

In a further preferred configuration, the semiconductor bodies are arranged in matrix-like fashion. Furthermore, the semiconductor bodies can expediently be electrically driven independently of one another.

In a further preferred configuration, the active regions of two semiconductor bodies are embodied for generating radiation in different-colored spectral ranges.

The embodiment of the device as a display apparatus, for example as an image display apparatus, is thus facilitated.

In a further preferred configuration, an encapsulation material, a luminescence conversion element and/or an optical element, for example a lens, is arranged on that side of the semiconductor body which is remote from the connection carrier and/or on that side of the planarization layer which is remote from the connection carrier, preferably on that side of the contact which is remote from the connection carrier. Particularly advantageously, the elements mentioned above can already be provided in the connection carrier assemblage and in particular can be connected to the connection carrier assemblage.

Preferably, therefore, an optical element assemblage is arranged on the connection carrier assemblage, in particular after the provision of the contact and/or of the planarization layer. The optical element assemblage preferably has a plurality of optical element regions. Before the connection carrier assemblage is divided into optoelectronic devices or during the dividing process, the optical element assemblage can, if appropriate, be severed into optical elements. The luminescence conversion element and/or the encapsulation material can also be applied to the semiconductor bodies connected to the connection carrier assemblage and in particular the semiconductor bodies fixed on the connection carrier assemblage.

In a further preferred configuration, the semiconductor body carrier is removed after the semiconductor bodies have been separated from the semiconductor body carrier, and a further semiconductor body carrier is provided.

Semiconductor bodies arranged on the further semiconductor body carrier can thereupon be connected to the connection carrier assemblage and separated from the further semiconductor body carrier in accordance with the method described above. In this case, semiconductor bodies arranged on the further semiconductor body carrier can each be fixed on a semiconductor body already connected to the connection carrier assemblage and in particular be electrically conductively connected to the latter semiconductor body, that is to say the semiconductor body already connected to the connection carrier assemblage.

BRIEF DESCRIPTION OF THE DRAWINGS

Further features, advantageous configurations and expediencies of the invention will become apparent from the following description of the exemplary embodiments in conjunction with the figures.

FIGS. 14A and 14B show a further exemplary embodiment of an optoelectronic device on the basis of two schematic plan views. FIG. 14A shows a plan view of that side of the connection carrier on which the semiconductor body of the device is arranged. FIG. 14B shows a plan view of that side of the connection carrier which is remote from the semiconductor body.

FIG. 15 shows a further exemplary embodiment of an optoelectronic device on the basis of a schematic plan view.

DETAILED DESCRIPTION OF THE DRAWINGS

Elements which are identical, of identical type and act identically are provided with identical reference symbols in the figures.

Figure 1A:
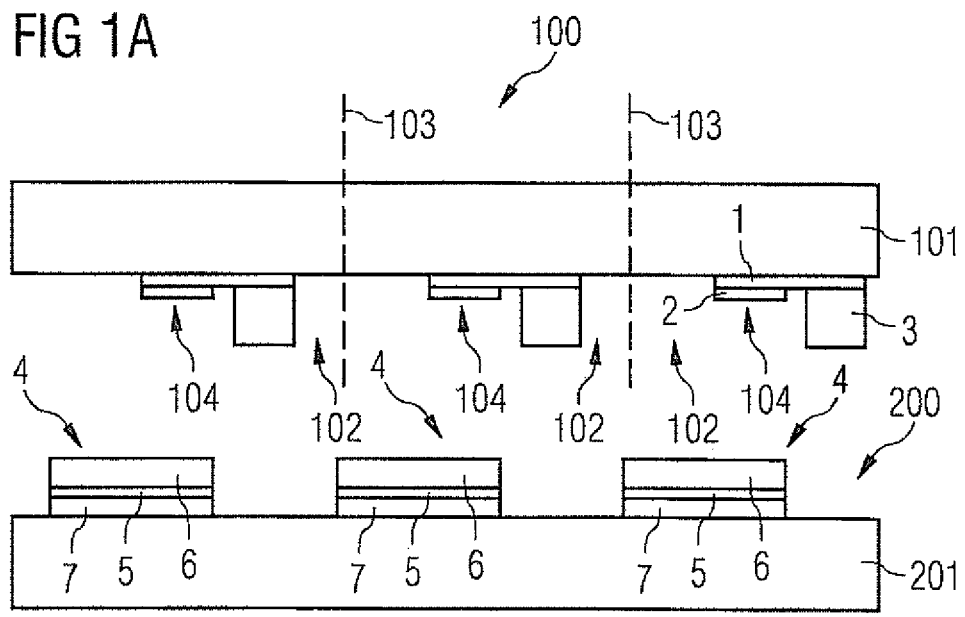
FIGS. 1A and 1B show an exemplary embodiment of a method for producing a plurality of optoelectronic devices on the basis of intermediate steps illustrated in schematic sectional views in FIGS. 1A and 1B.
Figure 1B:
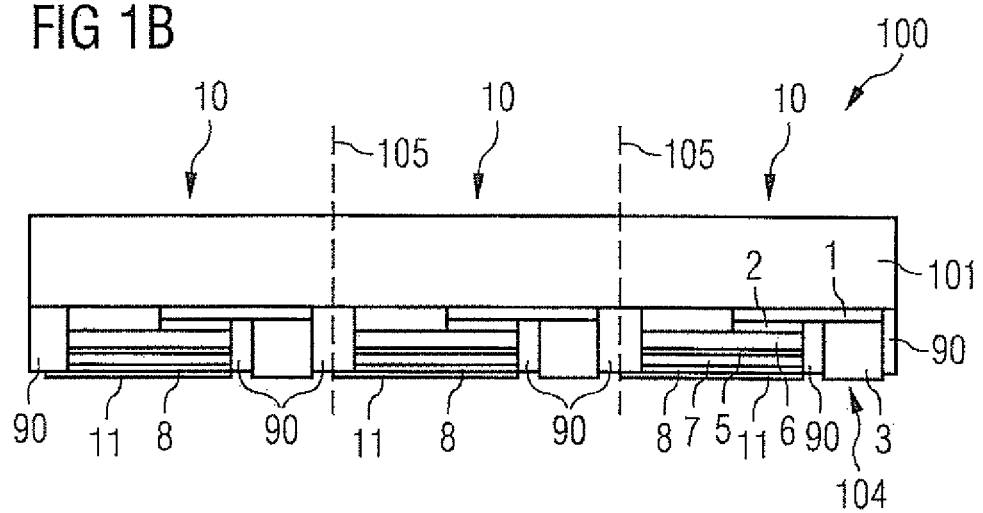

FIG. 1 shows an exemplary embodiment of a method for producing a plurality of optoelectronic devices on the basis of intermediate steps illustrated in schematic sectional views in FIGS. 1A and 1B.

Firstly, a connection carrier assemblage 100 is provided, FIG. 1A. In this case, the connection carrier assemblage comprises a connection carrier layer 101. The connection carrier assemblage 100 has a plurality of device regions 102. The device regions are formed by regions of the connection carrier layer 101 and are illustrated as separate from one another by the dashed lines 103 in FIG. 1A. The connection carrier layer 101 is expediently embodied in electrically insulating fashion.

An electrical connection region 104 is formed in the respective device region. The electrical connection region 104 preferably contains a metal or a plurality of metals or a metal compound or consists thereof. The connection region 104 can have a connection conductor layer 1. The connection conductor layer 1 can be applied, for example deposited, onto the connection carrier layer 101. By way of example, vapor deposition or sputtering is suitable for this purpose. The connection conductor layer 1 preferably contains a metal, for example Au, or consists thereof. After the connection conductor layer 1 has been applied, the connection conductor layer 1 can be galvanically reinforced. The current-carrying capacity of the connection conductor layer is thus increased.

The connection conductor layer can be deposited in patterned fashion for example by means of a mask, such as a photomask, for instance.

A fixing layer 2 of the respective connection region 104 is arranged on that side of the connection conductor layer 1 which is remote from the connection carrier layer 101. The fixing layer 2 is expediently embodied in electrically conductive fashion. The same applies to the connection conductor layer 1. The fixing layer 2 can be embodied as a solder layer, for example as a gold-tin solder layer, or as an adhesive layer embodied in electrically conductive fashion, for example as a silver conductive adhesive layer.

The fixing layer 2 can be applied to the connection carrier layer by means of a suitable mask (not explicitly illustrated). The connection region 104 furthermore comprises an electrical connection part 3. The connection part 3 can project above the fixing layer 2. The connection part 3 can be embodied as a connection lamina, for example as a metal lamina. The connection part 3 can be applied to the connection carrier layer 101 and in particular the connection conductor layer 1.

A thickness of the connection conductor layer 1 is preferably 5 µm or less, particularly preferably 3 µm or less, e.g. 1 µm or less. A thickness of the fixing layer 2 is preferably 5 µm or less, particularly preferably 3 µm or less, e.g. 2 µm or less. The connection part 3 can have a thickness of 10 µm or less, preferably 8 µm or less.

The connection carrier layer 101 can be embodied as a foil. The connection carrier layer can have in particular a thickness of 80 µm or less, preferably of 50 µm or less, particularly preferably of 40 µm or less, e.g. 30 µm or less or 20 µm or less.

That region of the connection region 104 which is occupied by the fixing layer 2 forms a mounting region of the respective device region. In the mounting region, semiconductor bodies can be fixed on the connection carrier assemblage.

The connection carrier layer 101 is preferably radiation-transmissive to a radiation which can be generated in a semiconductor body that is subsequently fixed on the connection carrier layer 101. By way of example, the connection carrier layer can comprise a glass, for instance a glass foil.

The device regions 102 are preferably distributed aerially over the connection carrier assemblage and in particular the connection carrier layer.

Furthermore, the method involves providing a semiconductor body assemblage 200. The semiconductor body assemblage has a semiconductor body carrier 201. A plurality of semiconductor bodies 4 are arranged and in particular fixed on the semiconductor body carrier 201. The semiconductor bodies 4 are preferably arranged in a manner distributed aerially over the semiconductor body carrier 201.

The semiconductor bodies 4 each comprise an active region 5. The active region 5 is preferably embodied for generating radiation. The respective semiconductor body is preferably embodied as a luminescence diode semiconductor body.

Furthermore, the semiconductor bodies 4 each comprise a semiconductor layer sequence. By way of example, the active region 5 can be arranged between two semiconductor layers 6, 7. These semiconductor layers 6, 7 are preferably of different conduction types, in particular doped for different conduction types (n-conducting or p-conducting). The semiconductor layer 6 can be embodied such that it is n-conducting or p-conducting.

The semiconductor bodies 4 are furthermore preferably grown epitaxially. A semiconductor layer structure for the semiconductor bodies can be deposited on a growth substrate epitaxially, for example by MOVPE (metal organic vapor phase epitaxy). Semiconductor bodies can then be formed from the semiconductor layer structure, for example by means of etching.

The semiconductor body assemblage and the connection carrier assemblage are arranged relative to one another in such a way that the semiconductor bodies 4 face the device regions 102.

The semiconductor bodies 4 are furthermore preferably arranged in accordance with a regular pattern on the semiconductor body 201. The connection carrier assemblage 100 and the semiconductor body assemblage 200 are expediently coordinated with one another in such a way that the respective semiconductor body extends over the mounting region—that is to say the fixing layer 2 in the respective device region 102—of the device region assigned to this semiconductor body.

For this purpose, either an arrangement of the semiconductor bodies on the semiconductor body carrier can be formed in a manner corresponding to the predefined mounting regions of a connection carrier assemblage, or the mounting regions of a connection carrier assemblage can be formed in accordance with a predefined arrangement of semiconductor bodies on a semiconductor body carrier.

For an arrangement of the semiconductor bodies on the semiconductor body carrier in accordance with the device regions, semiconductor bodies arranged on the growth substrate can be fixed on an intermediate carrier (not illustrated). The growth substrate can thereupon be removed from the semiconductor bodies. By way of example, a laser separating method or etching is suitable for this purpose. From the semiconductor bodies arranged on the intermediate carrier, semiconductor bodies can be selected and connected to the semiconductor body carrier in such a way that the arrangement of the semiconductor bodies arranged on the semiconductor body carrier 201 corresponds to that of the mounting regions. For this purpose, semiconductor bodies are expediently selectively removed from the intermediate carrier and transferred to the semiconductor body carrier in accordance with the arrangement of the mounting regions. Alternatively, selected semiconductor bodies can be separated from the growth substrate, for example by means of a laser separating method, and be connected to the semiconductor body carrier 201. An intermediate carrier can then be dispensed with.

By way of example, a layer, for example a foil, such as a thermorelease film, for instance, is suitable for the semiconductor body carrier 201. The foil can be arranged on an additional auxiliary carrier (not illustrated) in order to impart increased mechanical stability to the semiconductor body assemblage 200.

The connection carrier assemblage 100 and the semiconductor body carrier 201 are thereupon arranged with respect to one another in such a way that the semiconductor bodies 4 come into mechanical contact with the connection carrier assemblage, in particular the fixing layers 2 of the device region assigned to the respective semiconductor body 4. The semiconductor bodies 4 can subsequently be fixed on the connection carrier layer 101.

This can be done for example by soldering or adhesively bonding the semiconductor bodies to the connection carrier assemblage by means of the fixing layer 2.

After the semiconductor bodies 4 have been fixed to the connection carrier assemblage 100, the semiconductor bodies can be separated from the semiconductor body carrier 201. For this purpose, the semiconductor body carrier 201 can be stripped from the semiconductor bodies. By way of example, a laser separating method or etching is suitable for this purpose. If a thermorelease film is used for the semiconductor body carrier, then the semiconductor bodies can be separated from the semiconductor body carrier by heating the thermorelease film. The adhesion-promoting effect of a thermorelease film is reduced by heating. After the semiconductor bodies have been separated, the semiconductor body carrier can be removed, FIG. 13.

In this case, the connection region 104 is arranged in regions, preferably only in regions, between the connection carrier layer 101 and the semiconductor body 4. Therefore, that side of the respective semiconductor body which faces the connection carrier layer 101 is advantageously not completely shaded by the connection region 104. Absorption of radiation in the connection region 104 can thus be kept small.

Preferably, the fixing layer 2 is arranged over the whole area and the connection conductor layer 1 only in regions between the semiconductor body and the connection carrier layer. The connection part 3 can extend alongside the semiconductor body as far as that side of the semiconductor body which is remote from the connection carrier layer 101.

After the semiconductor bodies 4 have been separated from the semiconductor body carrier 201, a mirror layer 8 can be applied to that side of the semiconductor bodies 4 which is remote from the connection carrier layer. Alternatively, the mirror layer 8 can already be arranged on the semiconductor bodies which are still arranged on the semiconductor body carrier 201. The mirror layer is then expediently arranged between the respective semiconductor body 4 and the semiconductor body carrier 201.

The mirror layer 8 is preferably embodied in electrically conductive fashion and in particular electrically conductively connected to the active region. Particularly preferably, the mirror layer contains a metal or a metal compound. By way of example, the mirror layer contains Au, Al or Ag or consists thereof. Materials of this type are distinguished by high reflectivities for radiation that can be generated in the active region.

The mirror layer 8 can have a thickness of 1 µm or less, preferably of 800 nm or less, particularly preferably of 500 nm or less, e.g. of 300 nm or less.

A molding compound 90 is subsequently applied to the connection carrier assemblage 100. The molding compound is preferably electrically insulating. Furthermore, the molding compound is preferably transmissive to radiation that is to be generated in the active region. A short circuit of the possibly uncovered active region 5 via the molding compound is thus avoided. The molding compound can contain BCB, for example. The molding compound is preferably applied to the connection carrier assemblage 100 by spin-coating. The molding compound is thereupon solidified, for example by means of thermal curing.

In so far as that side of the semiconductor bodies which is remote from the connection carrier layer 101 is covered with the molding compound, that part of the molding compound which is arranged on this side of the semiconductor bodies is removed. That side of the semiconductor body 4 which is remote from the connection carrier layer 101 is thereby uncovered again. The possibly cured molding compound can be ground away for this purpose. A fly cutting method is also suitable for removing the possibly cured molding compound.

The molding compound advantageously protects the respective semiconductor body.

An electrical contact 11, e.g. a contact metallization, is subsequently applied to that side of the semiconductor bodies which is remote from the connection carrier layer 101. The contact can contain Ti, Pt, and/or Au, for example.

The contact 11 can have a thickness of 5 µm or less, preferably 3 µm or less, particularly preferably 2 µm or less, e.g. 1 µm or less, 800 nm or less, 500 nm or less or 300 nm or less.

By way of example, a deposition method, such as sputtering or vapor deposition, is suitable for applying the mirror layer 8 and/or applying the contact 11. The contact 11 preferably extends in layer-like fashion and in particular in large-area fashion over the semiconductor body 4. The contact 11 is electrically conductively connected to the semiconductor body 4, in particular by means of the mirror layer 8. Electrical contact can be made with the semiconductor body 4 by means of the connection part 3 and the contact 11.

In this case, the contact 11 can extend over that side of the solidified molding compound 90 which is remote from the connection carrier layer 101. A planarization layer is preferably formed by means of the molding compound.

The connection carrier assemblage 100 can subsequently be singulated along the lines 105 into optoelectronic devices 10, each comprising at least one, preferably exactly one, device region 102. The singulation can be effected by sawing or a laser-assisted singulation method, for example. The connection carrier layer 101 can be severed during singulation. Furthermore, the molding compound 90 can be severed.

Figure 2:
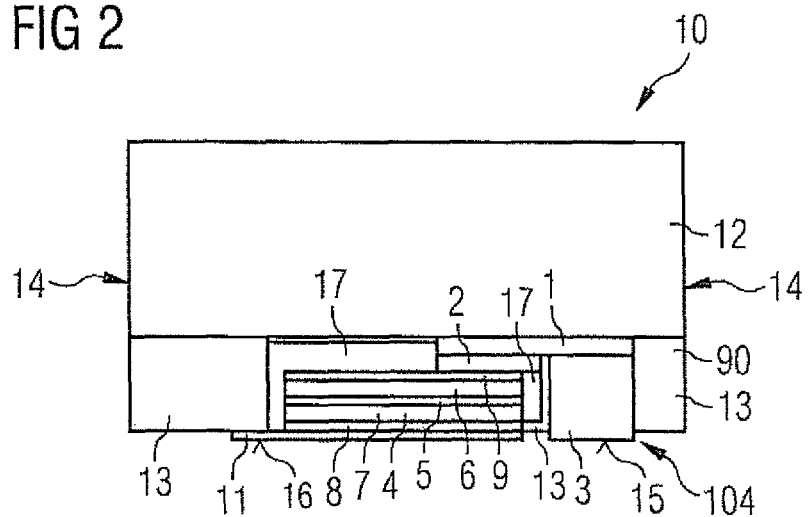
FIG. 2 shows an exemplary embodiment of an optoelectronic device on the basis of a schematic sectional view.

FIG. 2 shows, on the basis of a schematic sectional view, an optoelectronic device 10 produced in accordance with the method according to FIG. 1.

The optoelectronic device 10 has a connection carrier 12. The latter is preferably singulated from the connection carrier layer 101. Furthermore, the device has a planarization layer 13. The latter is arranged alongside the semiconductor body and can be formed from the molding compound 90. By means of the connection part 3 and the contact 11, the device can be electrically conductively connected, for example soldered, to an external conductor element, for example the conductor track or printed circuit board.

The device is embodied in surface mountable fashion, in particular. The connection region 104, in particular the connection layer 1, is arranged in regions between the semiconductor body 4 and the connection carrier 12 and extends alongside the semiconductor body. External electrical connection pads 15, 16 are formed on that side of the device which is remote from the connection carrier 12.

The connection carrier 12 in accordance with FIG. 2 has an electrically insulating carrier body 18, e.g. composed of glass, on which the connection region 104 is formed, in particular deposited. During the operation of the device, the radiation generated in the semiconductor body expediently radiates through the connection carrier.

The device preferably has a continuously singulated side area 14. The latter can be formed by the connection carrier and, if appropriate, the planarization layer 13.

By means of the mirror layer 8, the radiation generated in the semiconductor body 4 can be reflected in the direction of the connection carrier 12. The radiation power coupled out from the connection carrier is thus increased.

In contrast to the method in accordance with FIG. 1, the device 10 in accordance with FIG. 2 has a passivation layer 17. The latter is preferably applied to the semiconductor body 4. A passivation layer can be applied to the semiconductor bodies in the semiconductor body assemblage, in particular over the whole area over the entire assemblage. For making electrical contact with the semiconductor body by means of the connection region 104, the passivation layer can be removed in regions before the semiconductor bodies are fixed to the connection carrier assemblage. The passivation layer 17 is preferably embodied in electrically insulating fashion. By way of example, the passivation layer contains a silicon nitride, a silicon oxide or a silicon oxynitride. The passivation layer preferably extends alongside the semiconductor body and along the semiconductor body. The passivation layer 17 can extend between the semiconductor body 4 and the connection carrier 12. The passivation layer 17 can more extensively protect the semiconductor body 4. Furthermore, the passivation layer can make it easier for radiation to cross over from the semiconductor body into the connection carrier 12. The passivation layer can serve in particular as a refractive index matching layer between the semiconductor body and the surroundings thereof, that is to say that side of the passivation layer which is remote from the semiconductor body. Continued total reflection in the semiconductor body can thus be reduced.

In contrast to the device produced in the method in accordance with FIG. 1, the device in accordance with FIG. 2 has an electrical contact layer 9, e.g. a contact metallization. The contact layer 9 is electrically conductively connected to the semiconductor body 4. Furthermore, the contact layer 9 is preferably arranged between the connection carrier 12 and the semiconductor body 4. The contact layer 9 can be applied to the semiconductor bodies still arranged on the semiconductor body carrier 200. The contact layer can be deposited by means of a lithographic, in particular photolithographic, method.

The contact layer 9 is expediently arranged between the semiconductor body and the fixing layer 2. The contact layer 9 can extend in large-area fashion over the semiconductor body.

The contact layer is expediently embodied such that it is radiation-transmissive. The contact layer 9 can be cut out in regions for the passage of radiation. The contact layer can have, in particular, a current distribution structure 26, which is described in greater detail further below in connection with other exemplary embodiments.

The contact layer 9 can contain a radiation-transmissive and electrically conductive oxide, in particular a metal oxide. The radiation generated in the active region can radiate through a radiation-transmissive and electrically conductive oxide (TCO: Transparent Conductive Oxide), such as e.g. a tin oxide, a zinc oxide or an indium tin oxide. A cutout in the contact layer 9 for the passage of radiation, which is expedient particularly in the case of a metallization for the contact layer, can then be dispensed with. The contact layer can be embodied in particular in simplified fashion, that is to say without an increased risk of absorption losses, as a continuous, that is to say cutout-free, layer.

The fixing layer 2 is expediently electrically conductively connected to the contact layer. The fixing layer covers the semiconductor body preferably only partly. Via the contact layer 9, charge carriers can pass in a manner laterally distributed over the semiconductor body and homogenously into the active region 5 for generating radiation. Charge carriers can be introduced via the connection conductor layer 1 laterally into the region between the semiconductor body and the connection carrier. Via the fixing layer, the charge carriers are forwarded to the contact layer 9 and from there can be injected into the semiconductor body 4.

In this case, the contact layer can comprise a layer sequence, for example—as viewed from the semiconductor body—a Ti layer, a Pt layer and an Au layer (not explicitly illustrated). Preferably, the contact layer (sequence) is terminated by a soldering layer on the side remote from the semiconductor body. An Au layer terminating the contact layer sequence is particularly suitable for soldering to a solder layer, e.g. an AuSn layer, as fixing layer.

The contact layer 9 can have a thickness of 5 µm or less, preferably 3 µm or less, particularly preferably 2 µm or less, e.g. 1 µm or less, 800 nm or less, 500 nm or less or 300 nm or less.

A total height of the device can be 40 µm or less, e.g. 38 µm. The semiconductor body 4 can have a thickness of 10 µm or less, preferably of 7 µm or less. A thickness of the connection carrier 12 can be 50 µm or less, preferably 40 µm or less, particularly preferably 30 µm or less.

That part of the device 10 which is arranged on the connection carrier can have a total thickness of 10 µm or less. By way of example, the connection carrier 12 can have a thickness of 30 µm and the remaining part of the device can have a total thickness of 8 µm. The semiconductor body 2 can have a thickness of 6 µm.

Figure 3A:
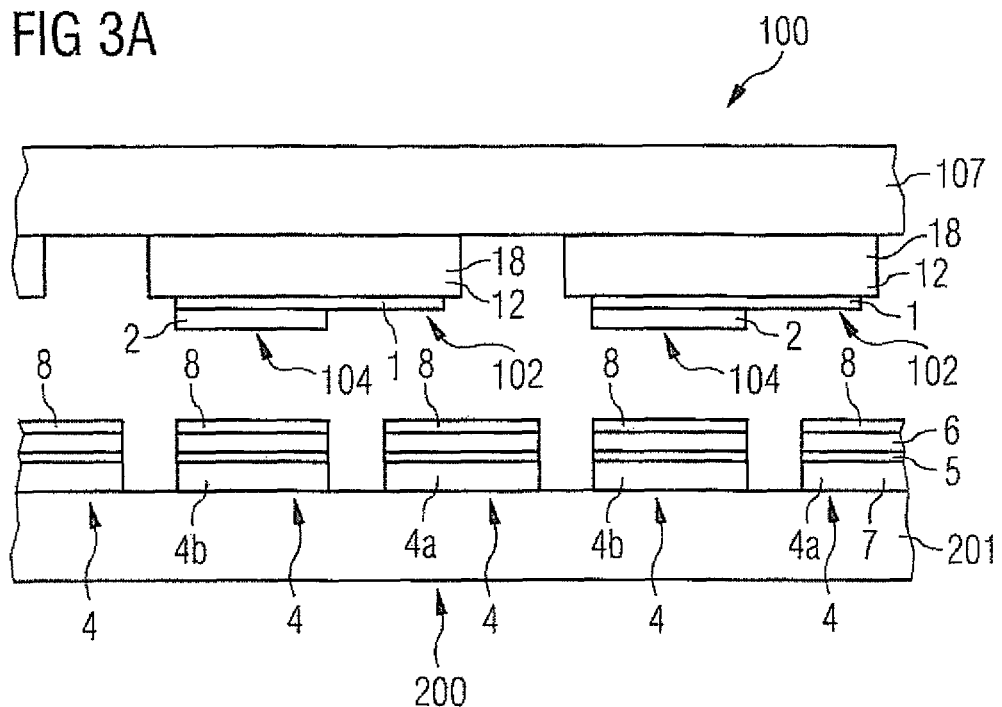
FIGS. 3A to 3C show a further exemplary embodiment of a method for producing a plurality of optoelectronic devices on the basis of intermediate steps illustrated in schematic sectional views.
Figure 3B:
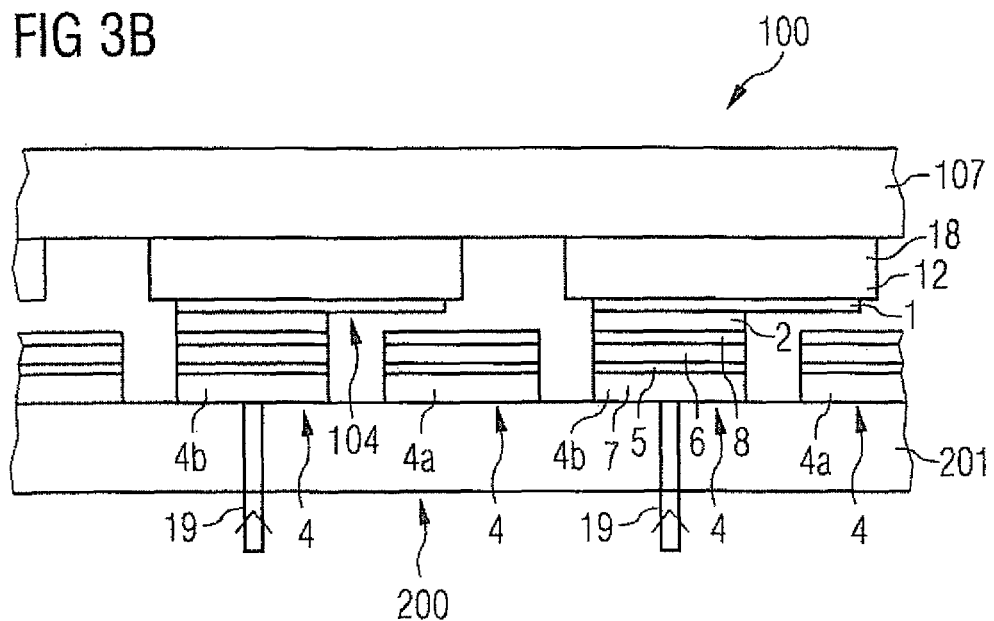
Figure 3C:
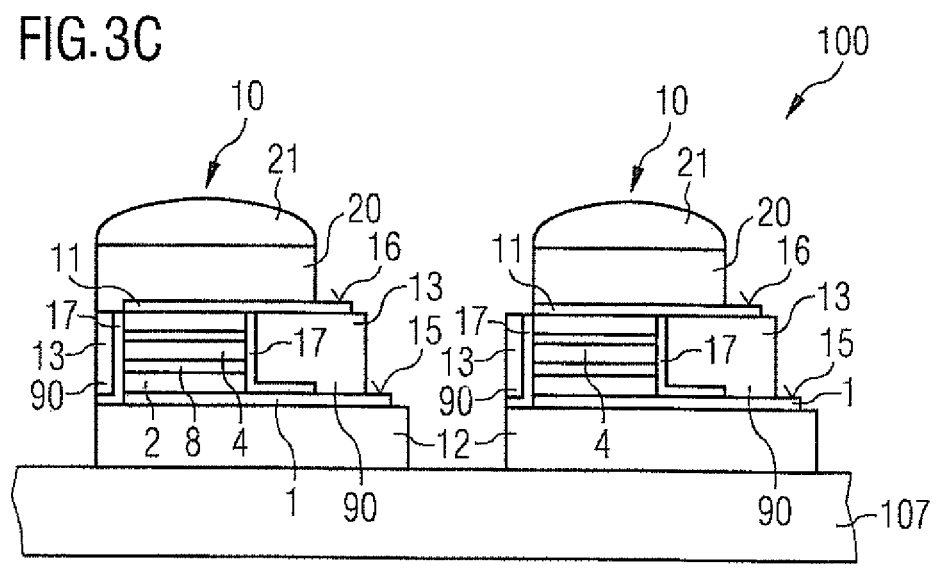

FIG. 3 shows a further exemplary embodiment of a method for producing a plurality of optoelectronic devices on the basis of intermediate steps illustrated in schematic sectional views in FIGS. 3A to 3C.

The method substantially corresponds to the method described in connection with FIG. 1.

Firstly, the connection carrier assemblage 100 is provided, FIG. 3A. In contrast to the exemplary embodiment in accordance with FIG. 1, the assemblage 100 does not have a continuous connection carrier layer on which device regions 102 each having a connection region 104 are formed. Rather, the connection carrier assemblage in accordance with FIG. 3A has a plurality of separate connection carriers 12 arranged on an auxiliary carrier 107, in particular an auxiliary carrier layer. The connection carriers 12 are expediently fixed on the auxiliary carrier. A connection carrier 12 can correspond, in particular, to a device region 102.

The respective connection carrier 12 has an electrically insulating carrier body 18, on which the connection region 104 is formed, in particular deposited.

The carrier body 18 of the respective connection carrier 12 is preferably embodied as a heat sink. For this purpose, the carrier body 18 expediently contains a material having a high thermal conductivity, e.g. of 70 W/(m*K) or more, preferably of 100 W/(m*K) or more, particularly preferably of 200 W/(m*K) or more. The carrier body 18 can contain, in particular, a ceramic, e.g. an aluminum nitride ceramic or aluminum oxide ceramic. These ceramic materials are distinguished by high thermal conductivities. Heat generated in the semiconductor bodies during the operation of the devices to be produced can be efficiently dissipated from the respective semiconductor body via the heat sink. The risk of thermally dictated damage to the semiconductor body is thereby reduced.

An electrically insulating carrier body, containing silicon, for example, can also be used.

By way of example, a sapphire- or silicon-containing auxiliary carrier is suitable for the auxiliary carrier 107. The connection carriers can be adhesively bonded onto the auxiliary carrier.

The connection carrier assemblage 100 is furthermore preferably embodied as a connection carrier wafer with device regions 102 or connection carriers distributed aerially over the assemblage.

Furthermore, the semiconductor body assemblage 200 with the semiconductor body carrier 201 and the plurality of semiconductor bodies 4 arranged on the semiconductor body carrier is provided. In contrast to the method in accordance with FIG. 1, the arrangement of the semiconductor bodies 4 on the semiconductor body carrier 201 is not coordinated with that of the mounting regions—that is to say with the arrangement of the fixing layers 2. In particular, the semiconductor body assemblage 200 has semiconductor bodies 4 which do not extend over a mounting region (cf. the semiconductor bodies 4a, for example).

The semiconductor body carrier 201 is preferably formed from the growth substrate on which a semiconductor layer structure from which the semiconductor bodies are formed was grown epitaxially. The semiconductor bodies can be formed from the semiconductor layer structure lithographically, in particular by means of a photolithographically formed mask and subsequent etching.

A distance between adjacent semiconductor bodies on the semiconductor body carrier can be 40 μm or less, preferably 30 μm or less, particularly preferably 20 μm or less, e.g. 10 μm or less or 5 μm or less. The distance between adjacent semiconductor bodies can be 2 μm, for example. Since the semiconductor bodies can be transferred to the connection carrier assemblage 100 without dividing up, e.g. sawing, the semiconductor body carrier (see above with regard to FIG. 1 and further below), interspaces between the semiconductor bodies do not have to be adapted to the dividing-up process. Sawing requires relatively wide trenches between the semiconductor bodies of often 60 μm or more. In the context of the method proposed, the semiconductor bodies can be densely packed on the semiconductor body carrier. The yield of semiconductor material from the semiconductor layer structure is increased by a reduction of the distance between the semiconductor bodies. This increases the efficiency of the production method and reduces the costs.

By way of example, a plasma etching method, e.g. high-rate plasma etching, is suitable for forming small distances between the semiconductor bodies.

A mirror layer 8 is arranged on the semiconductor bodies 4. The mirror layer 8 is furthermore arranged on that side of the respective semiconductor body 4 which is remote from the semiconductor body carrier 201. Further, in particular metallic, layers can be arranged on that side of the mirror layer which is remote from the semiconductor body (not explicitly illustrated). By way of example, a barrier layer that protects the mirror layer can be provided. The risk of a reduction of the reflectivity of the mirror layer in the course of fixing on the connection carrier assemblage can thus be reduced. By way of example, in the sequence as viewed from the semiconductor body, it is possible to provide a TiW(N) layer as barrier layer, followed by an adhesion-promoting layer, e.g. a Ti layer, a Pt layer and an Au layer.

The semiconductor body carrier 201 and the connection carrier assemblage 101 are arranged with respect to one another in such a way that the semiconductor bodies 4 face the device regions 102.

Semiconductor bodies 4 are thereupon placed on the mounting region over which they extend, FIG. 3B. On account of the fixing layer 2 provided only in regions on the connection conductor layer 1, the mounting region rises above the connection conductor layer. Semiconductor bodies 4a which do not extend over the fixing layer can thereby be prevented from coming into mechanical contact with the connection carrier assemblage. The risk that semiconductor bodies which are not to be transferred to the connection carrier assemblage will pass onto the connection carrier assemblage, e.g. through adhesion to the connection conductor layer 1, is thus reduced.

The semiconductor bodies 4b that are to be mounted on the connection carrier assemblage are subsequently fixed, e.g. adhesively bonded or soldered, on the connection carrier assemblage by means of the fixing layer 2.

The semiconductor bodies 4b connected to the connection carrier assemblage 100 are thereupon separated from the semiconductor body carrier 201. If appropriate, the separating process can also be effected before the fixing process. The semiconductor bodies 4a which are not connected to the connection carrier assemblage 100 remain on the semiconductor body carrier 201. The semiconductor bodies remaining on the semiconductor body carrier can be fixed on a further connection carrier assemblage by employing the method. Through selective removal of semiconductor bodies from the semiconductor body carrier 101, therefore, a semiconductor wafer can be progressively "harvested" by means of different connection carrier assemblages. In this case, those semiconductor bodies which extend over a mounting region of the respective connection carrier assemblage are separated from the semiconductor body carrier and fixed to the connection carrier assemblage.

The selective removal of only a portion of the semiconductor bodies from the semiconductor body carrier can be effected by means of a laser separating or stripping method, for example. In this case, an interface between the semiconductor body to be separated and the semiconductor body carrier can be irradiated with laser radiation 19. The adhesion of the semiconductor bodies to the semiconductor body carrier is thereby reduced or destroyed and the semiconductor bodies are separated from the semiconductor body carrier. The laser radiation 19 for separating the semiconductor bodies 4 preferably radiates through the semiconductor body carrier 201. For this purpose, the semiconductor body carrier is expediently transmissive to the radiation.

In this case, the semiconductor bodies 4 to be separated can be selected by means of a wafer map of the connection carrier assemblage 100, from which the position of the mounting regions of the connection carrier assemblage can be obtained, a predefined arrangement of the semiconductor body carrier and of the connection carrier assemblage relative to one another and, if appropriate, a wafer map of the semiconductor body carrier, from which the arrangement of the semiconductor bodies on the semiconductor body carrier can be obtained. The respective wafer map is expediently determined beforehand and suitably stored. In this way, the radiation 19 can be directed selectively onto those semiconductor bodies which are to be separated from the semiconductor body carrier and, in particular, have already previously been fixed to the connection carrier assemblage 100.

The semiconductor body carrier 201 with the semiconductor bodies 4a that have not been transferred to the connection carrier assemblage 100 can thereupon be removed. The remaining semiconductor bodies 4a can be fixed to a further connection carrier assemblage (not illustrated).

After the semiconductor bodies have been fixed to the connection carriage assemblage 100, the mirror layer 8 is arranged between the respective semiconductor body and the connection carrier 12, in particular between the semiconductor body and the connection region 104 assigned to this semiconductor body. The semiconductor body is expediently electrically conductively connected to said connection region 104.

After the removal of the semiconductor body carrier 201, that side of the semiconductor bodies fixed to the connection carrier assemblage which is remote from the mounting region is accessible for further process steps, FIG. 3c. The semiconductor bodies can be coated, for example, on this side.

A passivation layer 17 can be applied to the connection carrier assemblage 100 and in particular the semiconductor bodies 4. The passivation layer advantageously protects the semiconductor body 4. The passivation layer 17 can firstly be applied to the connection carrier assemblage over the whole area and subsequently be removed in regions, in particular from that side of the semiconductor bodies 4 which is remote from the mounting region, for the purpose of making electrical contact with the semiconductor body.

Furthermore, in or on the semiconductor bodies 4, it is possible to form a structure, in particular a coupling-out structure, by means of which it is possible to disrupt total reflection in the semiconductor body (not explicitly illustrated). The radiation power emerging from the semiconductor body can thus be increased. For this purpose, that side of the semiconductor body 4 which is remote from the mounting region can be etched, for example.

Furthermore, a molding compound 90, in particular for a planarization layer, e.g. a BCB, can be applied to the connection carrier assemblage 100. The molding compound for the planarization layer can be applied to the connection carrier assemblage by spin-coating. The applied molding compound is expediently cured.

A part of the molding compound that extends over that side of the semiconductor bodies which is remote from the mounting region can be removed from the assemblage before or after the solidification of the molding compound.

The molding compound can firstly be applied to the connection carrier assemblage over the whole area and can subsequently be removed in regions, with the result that a molding compound layer is provided in the respective device region.

The planarization layer 13 can extend over the connection conductor layer 1. The planarization layer 13 is arranged alongside the respective semiconductor body 4. The planarization layer 13 continues that surface of the semiconductor bodies 4 which is remote from the mounting region preferably in planar fashion.

The surface profile of the connection carrier assemblage, in particular of those parts of the assemblage which are applied to the connection carrier, can be smoothed by means of a planarization layer. Subsequent method steps that are to be carried out in planar technology are facilitated by a smoothed surface profile.

A planarization layer 13 can, if appropriate, also be formed by a thick passivation layer 17, e.g. having a thickness of 2 µm or more, preferably of 3 µm or more, particularly preferably of 5 µm or more (not illustrated). A separate planarization layer, e.g. composed of the molding compound, can then be dispensed with.

In the case of a (growth-)substrateless semiconductor body grown epitaxially, a thin fixing layer and the preferably thin mirror layer, the surface profile preferably has no pronounced elevations, e.g. of 15 µm or more. A planarization layer having the thicknesses mentioned above for the passivation layer can already provide for sufficient smoothing of the surface profile.

Subsequently—preferably after the planarization layer 13 has been provided—an electrical contact 11 is applied, in particular deposited, e.g. vapor-deposited or sputtered, onto that side of the respective semiconductor body 4 which is remote from the mounting region.

The contact 11 can be deposited lithographically by means of a mask (not explicitly illustrated). The contact 11 is preferably applied in such a way that part of that surface of the semiconductor body which is remote from the mounting region, for the passage of radiation, is not covered with the contact 11. The contact 11 can be applied as a layer. The contact can have a thickness of 10 µm or less, preferably of 5 µm or less, particularly preferably of 3 µm or less, e.g. of 2 µm or less or 1 µm or less. By way of example, the contact can have a thickness of 1 µm.

The contact 11 can extend, proceeding from the semiconductor body, over that side of the planarization layer which is remote from the connection carrier. The risk of a crack in the contact upon passing beyond the edge of the semiconductor body 4 is reduced by the smoothed surface profile.

The contact 11 can be embodied as a metallization. The contact 11 can contain one or a plurality of metals, e.g. Au, Pt and/or Ti. The contact 11 can be galvanically reinforced, if appropriate, after it has been applied.

An external electrical connection pad 16 of the device to be produced can be formed by means of an uncovered region of the contact 11. A further external electrical connection pad 15 of the device to be produced can be formed by means of an uncovered region, in particular not covered by the planarization layer 13, of the, if appropriate galvanically reinforced, connection conductor layer 1.

A luminescence conversion element 20 can subsequently be applied to the connection carrier assemblage and in particular the semiconductor bodies 4, e.g. to the respective contact 11. The luminescence conversion element preferably contains a phosphor, e.g. phosphor particles. By means of the luminescence conversion element, radiation generated in the active region can be converted into radiation having a different wavelength. The device to be produced can emit mixed-colored, preferably white, light. The mixed-colored light can have contributions of the radiation generated in the active region and of the radiation converted by the luminescence conversion element. The luminescence conversion element can be applied to the semiconductor body as a layer. By way of example, a lithographic method, in particular a photolithographic method, is suitable for application. The luminescence conversion elements can be positioned on the respective semiconductor body by means of a mask.

Suitable luminescence conversion elements are described in WO98/12757, the entire disclosure content of which is hereby explicitly incorporated by reference in the present application.

Furthermore, an optical element 21, preferably an optical element for beam shaping, such as a lens, can be applied to the connection carrier assemblage 100 and in particular the semiconductor bodies 4, e.g. to the respective contact 11 and/or to the luminescence conversion element 20. The optical elements can be applied as discrete elements or as an element assemblage having a plurality of optical element regions (not explicitly illustrated). In this case, an element assemblage, after it has been applied, is expediently divided into a plurality of optical elements each having an optical element region.

The luminescence conversion element 20 and/or the optical element 21 can be arranged on the contact 11. The luminescence conversion element 20 and/or the optical element 21 can be localized above the respective semiconductor body 4.

The connection carrier assemblage 100 can thereupon be divided into a plurality of optoelectronic devices 10. This can be done by removing the auxiliary carrier 107 from the connection carrier assemblage (not explicitly illustrated).

The mirror layer 8 is arranged between the connection carrier 12 and the semiconductor body 4. Radiation emerges from the semiconductor body via that side of the semiconductor body which is remote from the connection carrier. Through the mirror layer, a high radiation power can be attained on the radiation exit side.

The external connection pads 15, 16 of the device 10 lie in different planes, in particular. The connection pad 15 can lie in the plane of the connection carrier 12 and the connection pad 16 can lie in the plane of the planarization layer. Furthermore, both connection pads lie on that side of the connection carrier 12 on which the semiconductor body is arranged.

The simultaneous assemblage fabrication of a plurality of devices in accordance with the methods described above is extremely cost-effective. Individual processing steps can be largely or completely avoided.

By means of the method described above in connection with FIG. 3 it is possible not just to produce devices 10 having external connection pads 15, 16 lying in different planes. Rather, a contact conductor which is electrically conductively connected to that side of the semiconductor body which is remote from the mounting region can extend from this side in the direction of that side of the connection carrier which faces the semiconductor body. On this side of the connection carrier, the contact conductor can be electrically conductively connected to an additional connection region formed on the connection carrier.

In particular, it is possible to use a connection carrier 12 on which two electrical connection regions which are electrically insulated from one another are formed.

FIG. 4 shows various connection carriers on the basis of various schematic views in FIGS. 4A to 4D. These connection carriers can be used in a method described above.

The connection carriers 12 each have two electrical connection regions 104, 106 which are electrically insulated from one another. In this case, one connection region 104 can be provided for fixing the semiconductor body on the connection region. The semiconductor body is expediently electrically conductively connected to this connection region. The connection region provided for the mounting of the semiconductor body can, preferably in contrast to the other connection region, be provided with the fixing layer 2.

Alternatively, the semiconductor body can also be fixed alongside both connection regions on the connection carrier (not explicitly illustrated). The mounting region is then expediently not part of the connection region. The semiconductor body can be electrically conductively connected to the connection regions after the mounting of the semiconductor body. Contacts can be applied to that side of the semiconductor body which is remote from the mounting region by means of the method described in FIG. 3. For making electrical contact, e.g. contact conductors are led to the connection regions 104, 106.

Figure 4A:
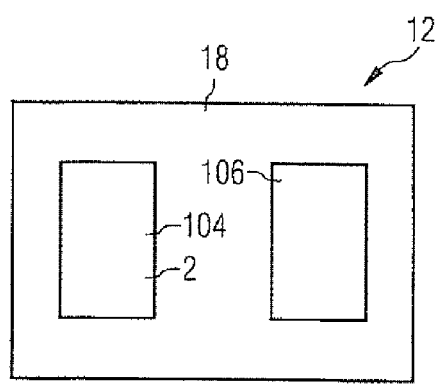
FIGS. 4A to 4D show connection carriers for the method or for a device on the basis of various views.
Figure 4B:
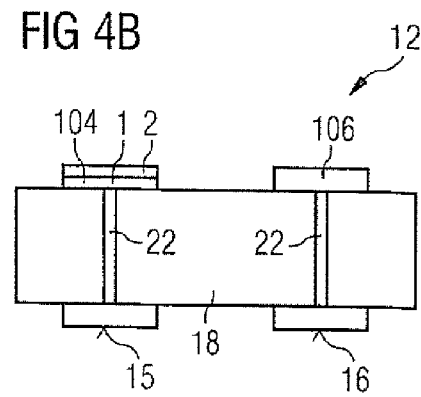
Figure 4C:
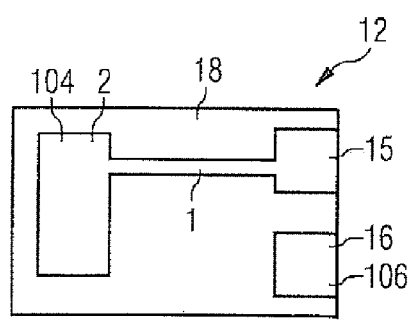

The connection carriers 12 illustrated schematically on the basis of FIGS. 4A, 4B and 4C each have an electrically insulating carrier body 18, e.g. a ceramic body or a silicon body, on which the connection regions 104, 106 are arranged. The connection regions are furthermore expediently arranged on the same side of the connection carrier.

A thickness of the respective connection carrier can be 100 µm or less or 50 µm or less, preferably 40 µm or less, particularly preferably 30 µm or less.

In this case, FIG. 4B can represent a sectional view through the connection carrier in accordance with FIG. 4A. In this case, the carrier body 18 is cut out in regions and has a connecting conductor 22 extending from the side of the carrier body with the connection regions as far as the side lying opposite said side. By means of the connecting conductor (so-called "via"), the connection region can be connected to an external connection pad 15 arranged on that side of the carrier body which is remote from the connection region. Said pad can be embodied as a solder pad, for example. The second connection region 106 can analogously be connected to a second connection pad 16 by means of a connecting conductor.

In accordance with the plan view in FIG. 4C, the first connection pad 15 is arranged on that side of the carrier body 18 which faces the connection regions 104, 106. The second connection pad 16 can likewise be arranged on that side of the carrier body 18 which faces the connection regions.

Figure 4D:
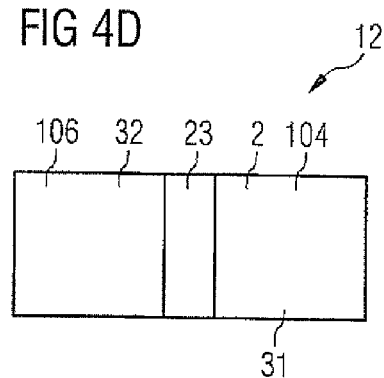

The connection carrier 12 in accordance with the plan view in FIG. 4D has two electrically conductive bodies 31, 32, e.g. two metal bodies or metal compound bodies, for instance composed of Cu or CuWo. Metals, in the same way as ceramics, are generally distinguished by high thermal conductivities. The bodies 31, 32 are connected to one another, e.g. adhesively bonded to one another, and in particular electrically insulated from one another, e.g. by means of an electrically insulating connecting layer 23. The connection regions 104, 106 can be formed by means of the surface of the body 31 and 32, respectively. Separate formation of connection regions by means of a connection conductor layer 1 can be dispensed with. If a semiconductor body is intended to be mounted on a connection region, it is expedient to provide this connection region with the fixing layer 2. The connection pads 15, 16 can be formed on that side of the connection carrier which is remote from the connection regions 104, 106.

It is particularly expedient, in the method for producing optoelectronic devices in accordance with FIG. 3, not to use separate connection carriers 12, but rather to use a connection carrier layer 101 having a plurality of device regions 102. An auxiliary carrier 107 can then be dispensed with in the method.

Figure 5:
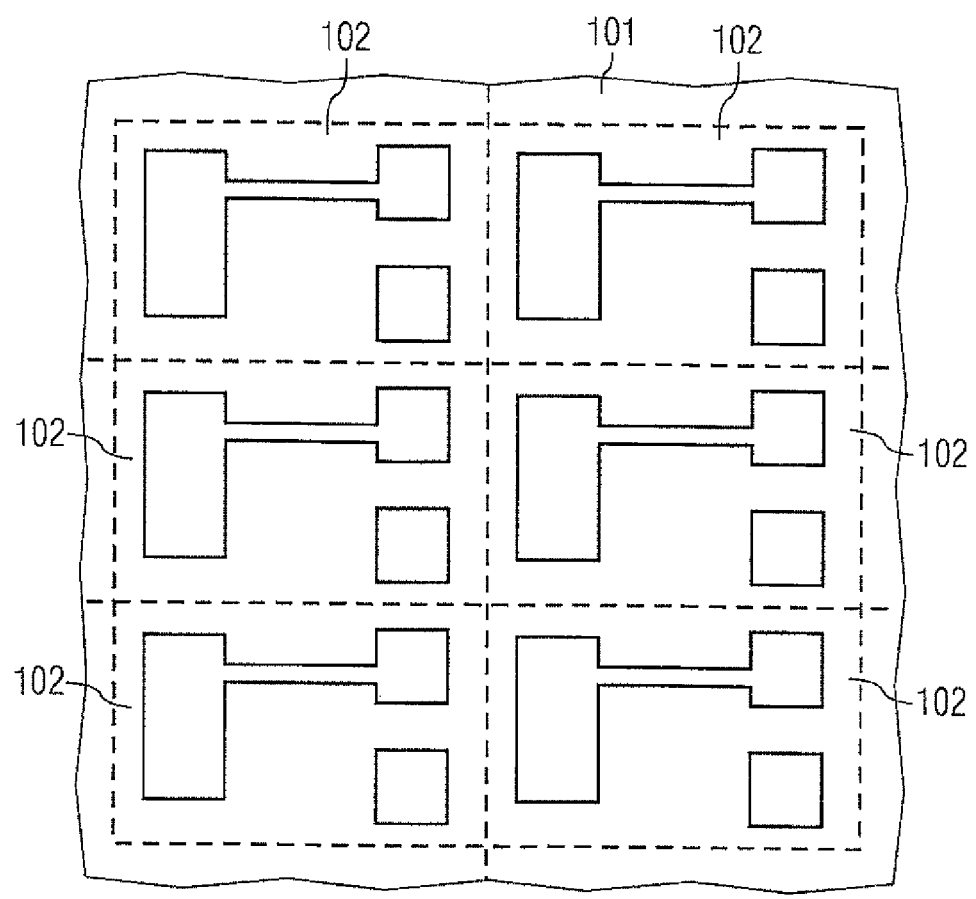
FIG. 5 shows a partial plan view of a connection carrier layer.

FIG. 5 shows a partial plan view of such a connection carrier layer 101. In this case, the respective device region corresponds to the connection carrier 12 illustrated in FIG. 4C. However, a connection carrier layer can also be embodied for differently configured connection carriers 12, e.g. the connection carriers illustrated in FIG. 4.

The connection carriers 12 of the individual devices 10 are then formed when the connection carrier assemblage is divided into devices. For this purpose, the connection carrier layer 101 can be severed along the dashed lines circumscribing e.g. one device region 102 in each case. The severing of the connection carrier layer, which comprises a ceramic, for example, for forming the devices, can be effected by means of a laser. Alternatively, or supplementarily, desired (predetermined) separating regions which preferably surround the respective device region, e.g. along the dashed lines, can be formed in the connection carrier layer 101. A desired (predetermined) separating region can be formed for example by a perforation of the connection carrier layer or a notch of the connection carrier layer.

Figure 6A:
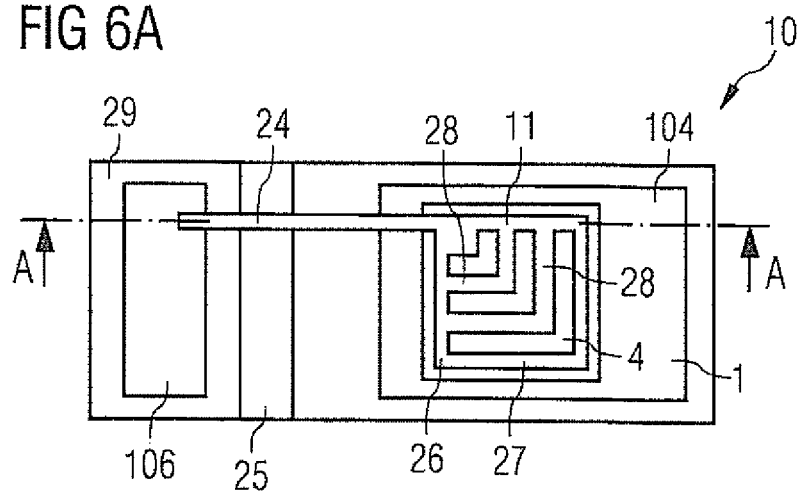
FIG. 6A shows an exemplary embodiment of an optoelectronic device on the basis of a schematic plan view.
Figure 6B:
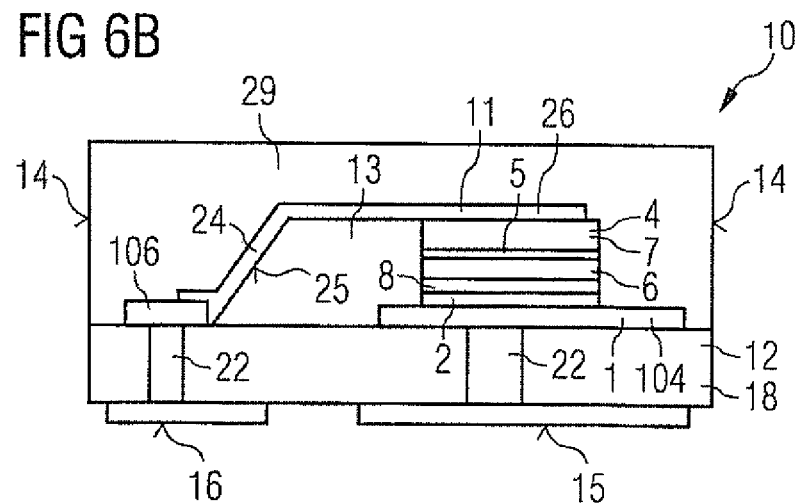
FIG. 6B shows a schematic sectional view along the line A-A from FIG. 6A.

FIG. 6 shows an exemplary embodiment of an optoelectronic device on the basis of a schematic plan view in FIG. 6A and a schematic sectional view in FIG. 6B along the line A-A from FIG. 6A. The device can be produced by the method described in connection with FIG. 3.

The device 10 substantially corresponds to the device produced in accordance with FIG. 3. In contrast thereto, a contact conductor 24 extends from that side of the semiconductor body 4 which is remote from the connection carrier 12 toward the connection carrier 12. The contact 11 preferably comprises the contact conductor 24. The contact conductor extends transversely, in particular obliquely, to the active region or the connection carrier along the semiconductor body 4.

The planarization layer 13 is arranged alongside the semiconductor body. The contact conductor 24 can be guided along a slope 25 of the planarization layer 13. The slope is preferably formed at that side of the planarization layer 13 which is remote form the semiconductor body.

The contact conductor 24 can extend along the semiconductor body in a manner spaced apart from the semiconductor body by way of the planarization layer 13. The contact conductor is furthermore connected to a connection region 106 formed on the connection carrier and in particular arranged on the side facing the semiconductor body. Along the planarization layer, the contact conductor can be guided to the plane of the connection carrier.

The slope 25 reduces the risk of the contact conductor 24 being severed. On account of the surface profile that is very flat anyway, a slope is not absolutely necessary.

If appropriate, a passivation layer can be applied to the semiconductor body (not explicitly illustrated). If said passivation layer is made sufficiently thick, an additional planarization layer can be dispensed with. An additional planarization layer can be provided despite the passivation layer.

With the connection carrier assemblage still present, the contact conductor 24 can be applied, in particular deposited, on to the assemblage.

The slope 25 can be formed after the application of material for the planarization layer in the method in accordance with FIG. 1, e.g. by removal of the material for the slope. Alternatively, the material for the planarization layer can also be applied to the assemblage in a manner such that it is already suitably patterned.

By means of the contact conductor 24, that side of the semiconductor body 4 which is remote from the connection carrier 12 is electrically conductively connected to the external connection pad 16. For this purpose, the contact conductor can be electrically conductively connected to the connection region 106 arranged alongside the semiconductor body on the connection carrier. The planarization layer 13 can be embodied as a contact ramp. The planarization layer 13 can taper proceeding from the connection carrier with increasing distance from the connection carrier.

The external connection pads 15, 16 arranged on that side of the connection carrier 12 which is remote from the semiconductor body are expediently electrically conductively connected to the respective connection region 104 and 106 via connecting conductors 22 extending through the electrically insulating carrier body 18. The device 10 is embodied in particular as a surface mountable device.

That part of the contact 11 which extends over the semiconductor body furthermore has a current distribution structure 26. By means of the current distribution structure, charge carriers can be distributed over the semiconductor body in large-area fashion. Charge carriers can thus be fed to the active region homogeneously, and can recombine there with the generation of radiation.

The current distribution structure 26 can comprise a frame 27. One or a plurality of spur lines 28 can branch off from the frame 27. The current distribution structure is furthermore cut out in regions, e.g. in L-shaped fashion, for the passage of radiation. Absorption of radiation in the e.g. metallic current distribution structure 26 can thus be reduced.

The contact 11—including the contact conductor and the current distribution structure—can comprise a continuous layer. In particular, the contact can be applied, in particular deposited, onto the semiconductor body 4 by means of lithography, e.g. photolithography, using a single mask, e.g. a photo (resist) mask.

The contact 11, e.g. the contact conductor and/or the current distribution structure, can have, in particular continuously, a thickness of 10 μm or less, preferably of 8 μm or less, particularly preferably of 5 μm or less, e.g. 2 μm or less or 1 μm or less. In order to increase the current-carrying capacity, the contact can be galvanically reinforced, if appropriate. A thick bonding pad used for contact-making purposes in conventional semiconductor chips and a bonding wire can be dispensed with.

An, expediently radiation-transmissive, encapsulation 29 is preferably arranged on that side of the semiconductor body which is remote from the connection carrier. Said encapsulation can contain e.g. an acrylic resin, an epoxy resin or a silicone resin or a silicone. Luminescence conversion particles can be embedded into the encapsulation. The encapsulation can extend, preferably completely, over that side of the contact 11, of the connection region 106, of the connection region 104, and/or of the semiconductor body 4, which is remote from the connection carrier. The encapsulation can protect the elements of the device against harmful external influences.

Material for the encapsulation can be applied to the connection carrier assemblage. When the connection carrier assemblage is divided into devices, it is possible to sever a continuous encapsulation layer which is used for the encapsulation. The device 10 can have singulated side areas 14.

Figure 7:
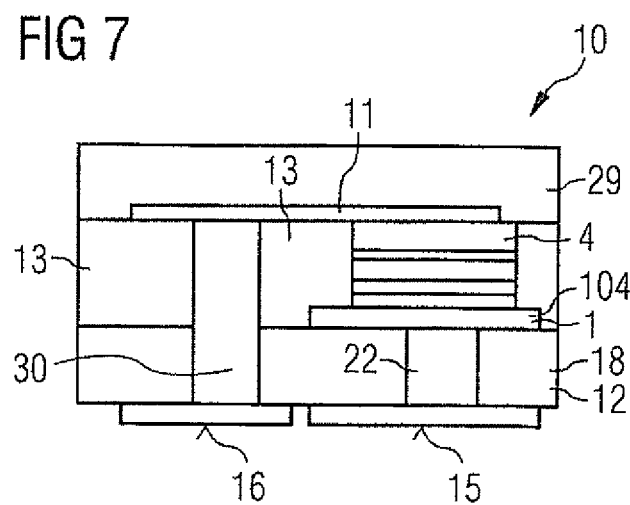
FIG. 7 shows a further exemplary embodiment of an optoelectronic device on the basis of a schematic sectional view.

FIG. 7 shows a further exemplary embodiment of an optoelectronic device on the basis of a schematic sectional view.

The device 10 substantially corresponds to the device described in connection with FIG. 6. In contrast thereto, only one connection region 104 is provided on the connection carrier 12. A guidance of the contact 11 to the connection carrier is dispensed with. For making electrical contact with the semiconductor body externally, the planarization layer 13 is cut out. A connecting conductor 30 extends in the region of the cutout through the planarization layer and is electrically conductively connected to the contact 11 and in particular the external electrical connection pad 16. For this purpose, the contact 11 expediently extends at least in regions over the cutout in the planarization layer 13.

Figure 8:
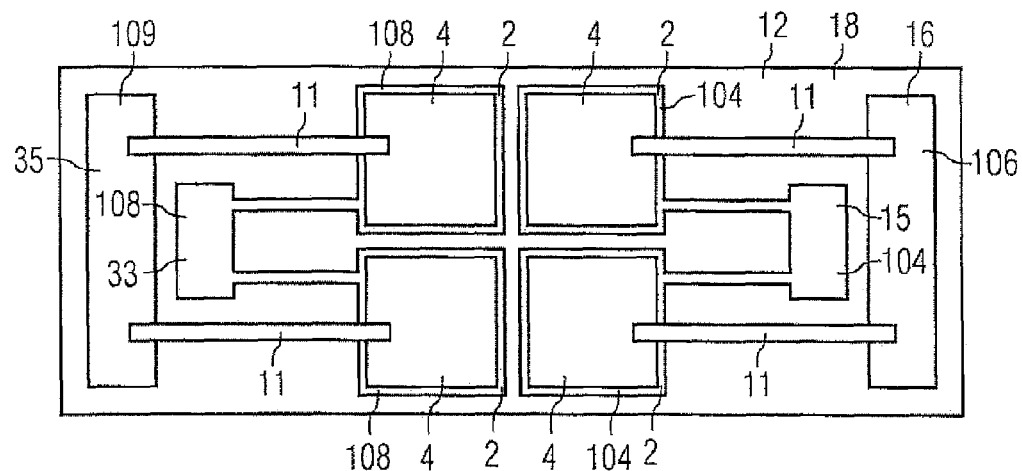
FIG. 8 shows a further exemplary embodiment of an optoelectronic device on the basis of a schematic plan view.

FIG. 8 shows a further exemplary embodiment of an optoelectronic device on the basis of a schematic plan view. The device 10 has a plurality of semiconductor bodies 4 which are arranged alongside one another on the connection carrier 12 and are fixed on the latter.

The semiconductor bodies 4 are fixed on a connection region 104, 108 assigned to the respective semiconductor body and are electrically conductively connected via the connection regions to an external connection pad 15 and 33, respectively, arranged alongside the semiconductor bodies. Furthermore, the semiconductor bodies are in each case electrically conductively connected via a contact 11 to a further external connection pad 16 or 35, respectively, formed on the connection carrier 12, in particular to a further connection region 16 or 109, respectively. A distance between the semiconductor bodies can correspond to the distance previously between the semiconductor bodies 4 on the semiconductor body carrier, since the semiconductor bodies can be transferred directly to the connection carrier (assemblage) in the method. In particular, the distance between adjacent semiconductor bodies can be 5 µm or less, e.g. 2 µm.

For this purpose, the distances between the mounting regions are preferably adapted to those between the semiconductor bodies on the semiconductor body carrier. The mounting regions can, if appropriate, also be formed in such a way that the respective semiconductor body completely covers the mounting region assigned thereto (not explicitly illustrated). For this purpose, a distance between the mounting regions (the fixing layers 2) is expediently chosen to be greater than the distance between the semiconductor bodies on the semiconductor body carrier. However, the distance between the mounting regions is preferably chosen to be small enough that semiconductor bodies that are adjacent on the semiconductor body assemblage can also be transferred to adjacent mounting regions of the common device region of the connection carrier assemblage.

Figure 9:
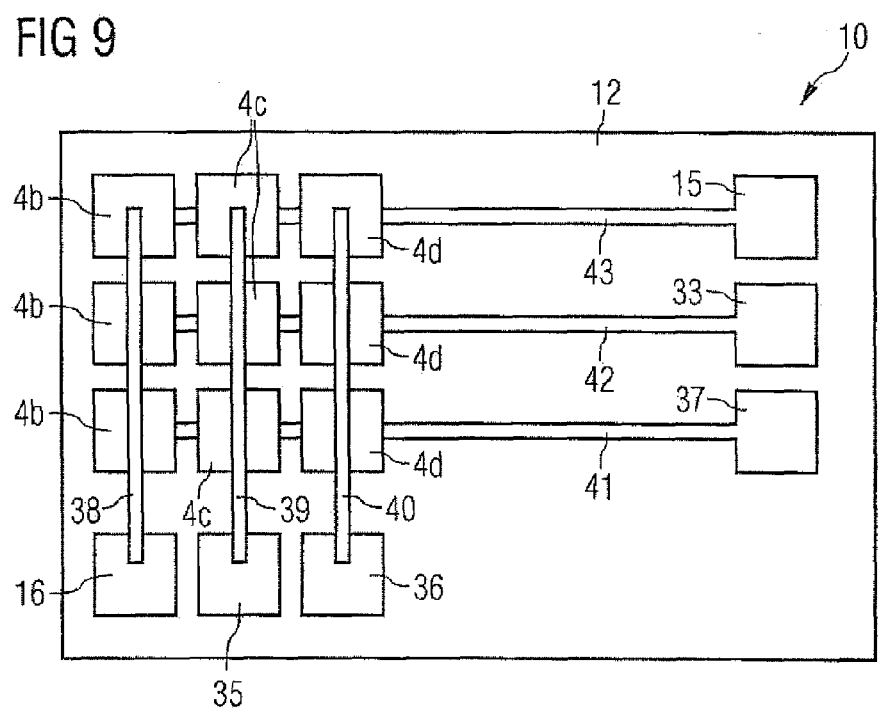
FIG. 9 shows a further exemplary embodiment of an optoelectronic device on the basis of a schematic plan view.

FIG. 9 shows a further exemplary embodiment of an optoelectronic device 10 on the basis of a schematic plan view.

The device has a plurality of semiconductor bodies 4b, 4c and 4d. This semiconductor bodies can have distances between one another analogously to the semiconductor bodies in accordance with FIG. 8. The semiconductor bodies are preferably embodied for generation of radiation in different-colored spectral ranges, in particular in the spectral ranges of three primary colors. The semiconductor bodies 4b can be embodied for red radiation, the semiconductor bodies 4c for green radiation and the semiconductor bodies 4d for blue radiation. A semiconductor body triad (4b, 4c, 4d) can form a pixel for an image display apparatus. The semiconductor bodies can advantageously be densely packed on account of the direct transfer from a wafer. On account of the mirror layer, which, in accordance with the previous figures, is expediently arranged between the respective semiconductor body and the fixing layer assigned to this semiconductor body, the exit-side luminance of the individual semiconductor bodies is advantageously high. On account of the dense arrangement of the semiconductor bodies alongside one another, it is possible to increase the luminance from a virtual area covering all the semiconductor bodies.

The semiconductor bodies are preferably arranged in matrix-like fashion in rows and columns. The semiconductor bodies can be driven individually via row lines 41, 42, 43, which are in each case electrically conductively connected to the semiconductor bodies 4d, 4c, 4b of a row, and via column lines 38, 39, 40, which are in each case electrically conductively connected to the semiconductor bodies of a column. The row line 41, 42 or 43 is electrically conductively connected to the connection pad 15, 33 or 37, respectively, and the column line 38, 39 or 40 is electrically conductively connected to the connection pad 16, 35 or 36, respectively.

The row lines can be formed if appropriate together with the respectively associated connection pad lithographically on the connection carrier. The column lines can be formed lithographically—in a manner analogous to the contacts 11 (see further above). If appropriate, the column lines and the respectively associated connection pad can be formed by means of lithography using a common mask.

If appropriate, an optical unit, e.g. for a projection apparatus, can be disposed downstream of the semiconductor bodies on the side remote from the connection carrier 12 (not explicitly illustrated).

Since the semiconductor bodies, in the context of the methods, are transferred directly from the semiconductor body carrier, e.g. the growth substrate, to the connection carrier assemblage, the semiconductor bodies can be freely shaped. In particular, semiconductor bodies which cannot be handled, or can be handled only with difficulty, by means of conventional automatic placement machines, for example for placement by means of pick and place, can be processed without difficulties for devices in the method proposed.

A semiconductor body can have for example in an extension direction of the active region a transverse dimension, e.g. a width, of 50 µm or less, preferably 40 µm or less, particularly preferably 30 µm or less, e.g. 20 µm or less or 10 µm or less. A longitudinal dimension, e.g. a length, of the semiconductor body along the active region can be 1 mm or more, preferably 2 mm or more, particularly preferably 5 mm or more, e.g. 8 mm or more or 10 mm or more.

Figure 10A:
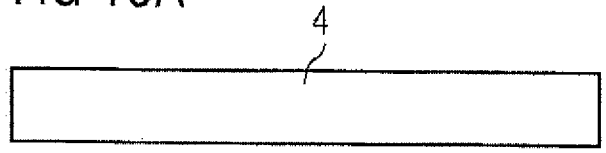
FIGS. 10A and 10B show two semiconductor bodies on the basis of schematic plan views.

The semiconductor body 4 can have a rectangular plan, and in particular a cuboid shape (cf. the plan view in FIG. 10A). Such a shaping is particularly advantageous for a high radiation coupling-out efficiency.

Figure 10B:

Even more unconventional shapings for semiconductor bodies can also be processed without any problems for devices in the context of the methods described above (cf. e.g. the semiconductor body with a star-shaped plan in FIG. 10B).

Furthermore, the semiconductor bodies for the devices can advantageously be scaled substantially freely with regard to the dimensions. Connection regions in the device regions of the connection carrier assemblage can be configured independently of the embodiment of the semiconductor bodies since the contact-connection of the semiconductor bodies—e.g. by means of the contact 11—can be effected in a planar process by means of the planarization layer. In particular, the respective contact can be guided along the planarization layer to the respective connection region.

It should be noted that the semiconductor body need not necessarily be mounted and contact-connected on an electrical connection region. Rather, it is also possible to use a semiconductor body in a device which is electrically contact-connected on different sides of the active region, wherein both contacts extend, preferably along the planarization layer, proceeding from that side of the semiconductor body which is remote from the connection carrier, in the direction of the connection carrier and are connected there, if appropriate, to a connection region. A semiconductor body of this type is expediently mounted directly on the carrier body 18.

Figure 11:
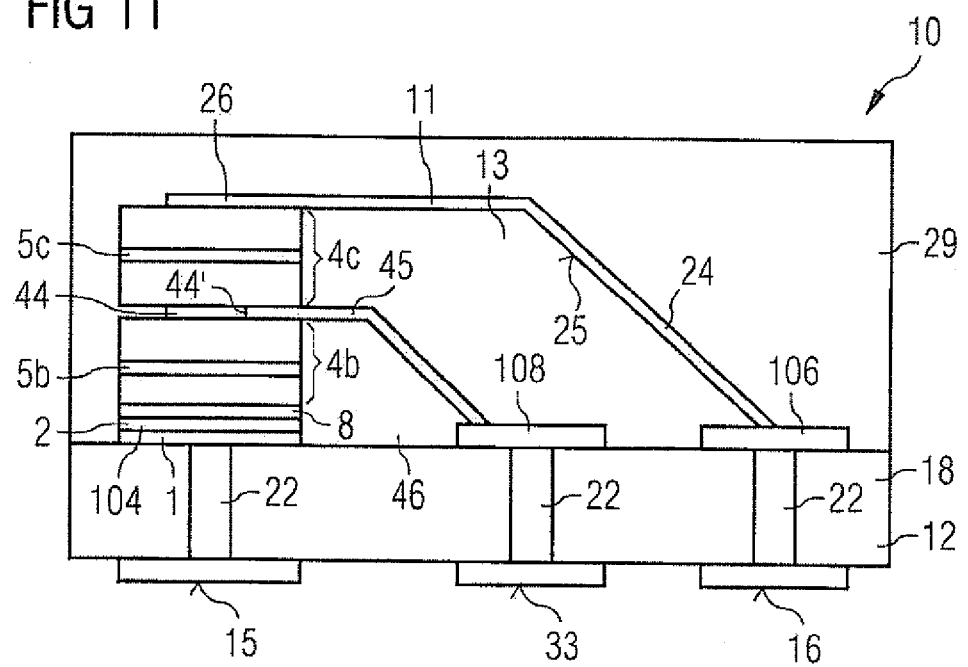
FIG. 11 shows a further exemplary embodiment of an optoelectronic device on the basis of a schematic sectional view.

FIG. 11 shows a further exemplary embodiment of an optoelectronic device on the basis of a schematic section view.

The device 10 substantially corresponds to the devices described in connection with the previous figures. In contrast thereto, in the case of the device in accordance with FIG. 11, a semiconductor body 4c is arranged on a further semiconductor body 4b. In this case, the semiconductor body 4c is preferably grown epitaxially and formed in particular in (growth-)substrateless fashion. The semiconductor body 4c is arranged on that side of the semiconductor body 4b which is remote from the mounting region of the semiconductor body 4b on the connection carrier 12.

The semiconductor bodies 4b, 4c are furthermore electrically conductively connected. For this purpose, a connecting contact 44 is arranged between the semiconductor bodies. By means of the connecting contact, the semiconductor bodies 4b, 4c can be operated in a manner interconnected in series.

Radiation generated in the semiconductor body 4b expediently radiates through the semiconductor body 4c. When both semiconductor bodies are operated simultaneously, the radiation generated in the respective semiconductor body can be superimposed to form mixed radiation on that side of the semiconductor body 4c which is remote from the mounting region. Absorption losses in a (growth) substrate of the semiconductor body can be avoided. At the same time, in the case of a (growth-)substrateless embodiment of the two semiconductor bodies, the structural height is advantageously kept small.

The connecting contact 44 preferably extends only over a partial region of that surface of the semiconductor body 4b which is remote from the connection carrier. This makes it easier for radiation to pass over from one semiconductor body to the other semiconductor body. For this purpose, the connecting contact can be embodied with a comparatively small area and extends for example over 50% or less of the surface of the semiconductor body. Alternatively or supplementarily, the connecting contact 44 can be cut out in regions for the passage of radiation.

The active regions 5b, 5c can be embodied for generating radiation of the same color and/or radiation having the same wavelength. The luminance of this radiation that emerges from the semiconductor body 4c can thus be increased by a contribution of the radiation generated in the semiconductor body 4b.

Alternatively, the semiconductor bodies 4c and 4b, in particular the corresponding active regions 5c, 5b, can be embodied for generating radiation having different wavelengths, in particular in different-colored spectral ranges. Expediently, the semiconductor body 4b is then embodied for generating radiation having a higher wavelength, e.g. in the red or green spectral range, than the semiconductor body 4c, which is embodied e.g. for green or blue radiation. Absorption losses of the radiation from the semiconductor body 4b in the semiconductor body 4c can thus be reduced or avoided. For this purpose, the active region 5c, in particular the semiconductor body 4c, expediently has a larger band gap than the active region 5b. After radiating through the semiconductor body 4c, mixed-colored radiation, in particular white light, can thus arise.

Furthermore, the semiconductor bodies 4b and 4c can preferably be electrically driven independently of one another, such that either the semiconductor body 4b or the semiconductor body 4c or both semiconductor bodies together can be operated.

For this purpose, a contact conductor 45, which can have a common layer with the connecting contact 44 and in particular can be embodied integrally with the connecting contact 44, is expediently electrically conductively connected to an external connection pad 33. The contact conductor 45 can be connected to an electrical connection region 108 formed on the connection carrier. The contact conductor 45 can be guided by means of a planarization layer 46, which if appropriate runs obliquely on the edge side, in the direction of the connection carrier and in particular to the connection region 108. The contact 11 of the semiconductor body 4c can be guided e.g. by means of a planarization layer 13 to the connection carrier 12 and can be electrically conductively connected to an external connection pad 16.

By means of the connection pads 15, 16 and 33, which are preferably arranged on that side of the connection carrier which is remote from the semiconductor bodies, the semiconductor bodies 4b, 4c can be operated independently of one another.

In order to produce a device of this type, firstly the semiconductor body 4b can be applied to the connection carrier assemblage and be separated from the corresponding semiconductor body carrier. The connecting contact, e.g. comprising a metallization or a metal compound, is thereupon applied, e.g. deposited, onto the semiconductor body 4b fixed on the connection carrier assemblage. The semiconductor body 4c is subsequently transferred to this semiconductor body, and in particular the connecting contact 44, either from the same semiconductor body carrier or another semiconductor body carrier. The further method steps can be carried out in the manner described above.

It goes without saying that in this way three or more semiconductor bodies can also be stacked one on top of another and in particular be electrically conductively connected to one another. An arrangement of three semiconductor bodies one above another is particularly expedient. These semiconductor bodies can be embodied as "stack pixels" for a full-color representation. By means of a juxtaposition of a plurality of such "stack pixels" in a device region, a display apparatus, in particular a full-color image display apparatus, can be realized particularly compactly. Preferably, in the sequence as viewed from the connection carrier, the first semiconductor body is embodied for generating red radiation, the second semiconductor body for generating green radiation and the third semiconductor body for generating blue radiation.

For the case where the semiconductor bodies 4b, 4c are only intended to be operated together, the contact conductor 45 can be dispensed with. The connecting contact 44 thus only connects the two semiconductor bodies. A connecting contact of this type can be completely covered by the semiconductor bodies. In particular, it can be embodied with a smaller area than the semiconductor bodies 4b, 4c. This is indicated by the line 44', which can delimit the connecting contact 44.

Figure 12:
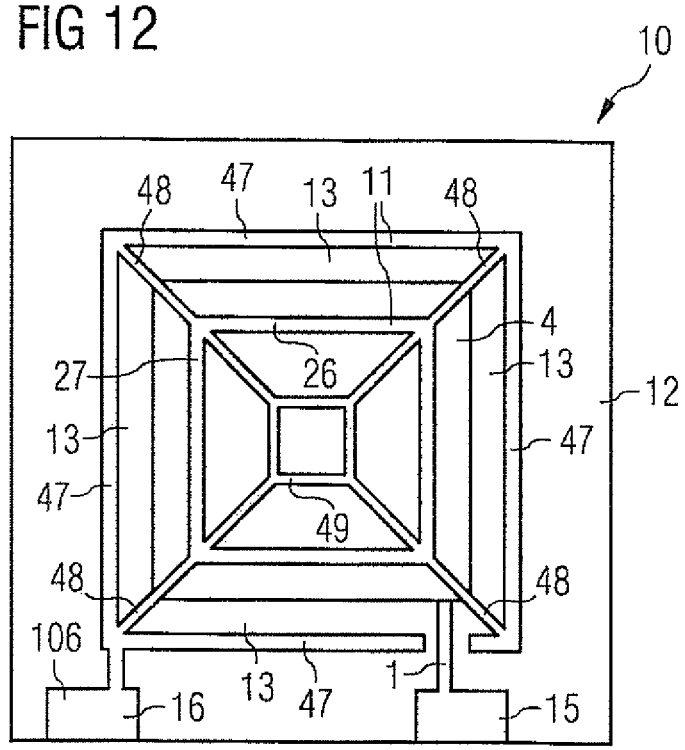
FIG. 12 shows a further exemplary embodiment of an optoelectronic device on the basis of a schematic plan view.

FIG. 12 shows a further exemplary embodiment of an optoelectronic device on the basis of a schematic plan view.

The device 10 substantially corresponds to the devices described in connection with the previous figures. In contrast thereto, a current distribution line 47 runs, in a plan view of the connection carrier 12, alongside the semiconductor body 4 and along the semiconductor body. The current distribution line 47 can run alongside a plurality of sides of the semiconductor body 4. In particular, the current distribution line can run on all sides alongside the semiconductor body. The current distribution line 47 preferably runs in the plane of the connection carrier 12. Furthermore, the current distribution line is preferably electrically conductively connected to the external electrical connection pad 16 of the device 10.

By means of the current distribution line 47, which preferably runs around the semiconductor body in track-like fashion, charge carriers can be distributed peripherally around the semiconductor body. This distribution can still take place on the connection carrier 12, that is to say before the charge carriers are passed to that side of the semiconductor body 4 which is remote from the connection carrier 12.

The current distribution line 47 is expediently electrically insulated from a contact element for making contact with that side of the semiconductor body which faces the connection carrier, e.g. the connection conductor layer 1 and in particular the external connection pad 15. For making contact with that side of the semiconductor body which faces the connection carrier, e.g. by means of the connection conductor layer 1, the current distribution line can be interrupted, wherein the connection conductor layer expediently extends in the region of the interruption from that side of the current distribution line which is remote from the semiconductor body to the semiconductor body.

The current distribution line 47 is preferably electrically conductively connected to that side of the semiconductor body 4 which is remote from the connection carrier 12. One or a plurality of current feed lines 48 can be electrically conductively connected to the current distribution line 47. The (respective) current feed line 48 preferably extends, proceeding from the current distribution line, in the direction of the semiconductor body and in particular right over that side of the semiconductor body 4 which is remote from the connection carrier 12. The (respective) current feed line 48 can be guided along a possibly beveled planarization layer 13 onto the semiconductor body.

By means of the current feed lines 48, charge carriers that are already distributed laterally around the semiconductor body can be conducted to the semiconductor body from a plurality of sides. The current feed lines 48 can be electrically conductively connected to a current distribution structure 26 arranged on the semiconductor body. The current distribution structure can have a frame 27. The current distribution structure 26 preferably has an outer frame, the frame 27, and an inner frame 49. The outer frame can run around the inner frame, in particular completely. The frames are preferably electrically conductively connected to one another. In particular, the (respective) current feed line 48 can extend from the frame 27 as far as the frame 49.

Preferably, the current distribution structure 26, in particular the frame 27 and/or the frame 49, the current feed line(s), the current distribution line 47, the electrical connection region 106 and/or the external electrical connection pad 16 have a continuous layer. These elements, in particular the contact 11 and the connection region 106 and/or the external connection pad 16, can be applied, in particular deposited, onto the connection carrier (assemblage) 12 (100) lithographically, in particular photolithographically, using a common mask. In order to increase the current-carrying capacity, the elements mentioned can be galvanically reinforced.

A lateral charge carrier distribution around the semiconductor body is expedient in particular for semiconductor bodies which are embodied for generating a high radiation power.

The semiconductor body can be embodied for generating a radiation power of 1 W or more. The semiconductor body can have a longitudinal dimension, e.g. a length, of 1 mm or more, preferably of 2 mm or more, and/or a transverse dimension, e.g. a width, of 1 mm or more, preferably of 2 mm or more. Such planar semiconductor bodies are particularly suitable for generating high radiation powers.

Figure 13:
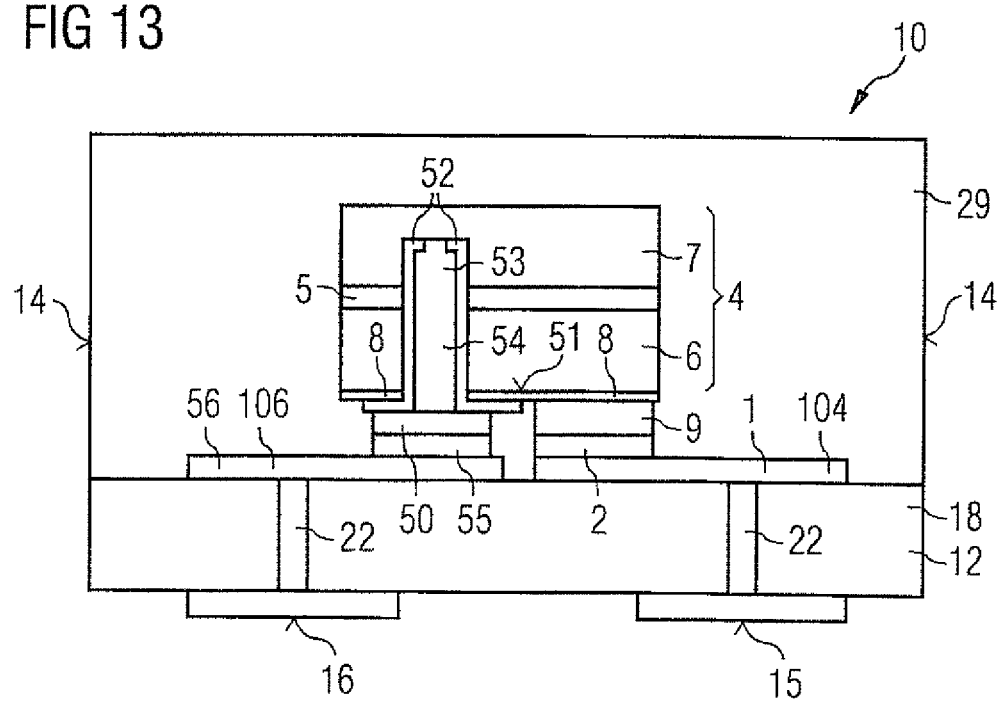
FIG. 13 shows a further exemplary embodiment of an optoelectronic device on the basis of a schematic sectional view.

FIG. 13 shows a further exemplary embodiment of an optoelectronic device on the basis of a schematic sectional view.

The device 10 substantially corresponds to the devices described in connection with the previous figures and can be produced in particular by means of one of the methods described above, e.g. the method in accordance with FIG. 3.

In contrast to the devices described above, two electrically conductive contact layers 9, 50 are arranged on the semiconductor body 4. The contact layers, e.g. each embodied as a contact metallization, are arranged on the same side of the semiconductor body and in particular on that side of the semiconductor body 4 which faces the connection carrier 12.

The contact layers are connected to the semiconductor body 4 on different sides of the active region 5. The contact layer 9 can be electrically conductively connected to the semiconductor layer 6 and the contact layer 50 can be electrically conductively connected to the semiconductor layer 7.

Furthermore, a surface 51 of the semiconductor body that faces the two contact layers is preferably arranged in regions between the two contact layers 9, 50 and the active region 5. The contact layers can extend in particular over a common surface of the semiconductor body 4, e.g. the surface 51 of the semiconductor body 4. The mirror layer 8 can be arranged between the two contact layers and the semiconductor body.

With regard to the surface 51, the contact layers are expediently electrically insulated from one another in order to avoid a short circuit. For this purpose, an electrical insulation layer 52, e.g. containing a silicon nitride, a silicon oxide or a silicon oxynitride, is expediently arranged between the semiconductor body 4 and the contact layer 50.

In the active region 5, a cutout 53 can be formed, e.g. by means of a recess in the semiconductor body. Through the cutout 53, the contact layer 50 can be electrically conductively connected to that side of the semiconductor body which is remote from the contact layers. A through contact 54 is expediently arranged in the cutout, by means of which through contact the contact layer 50 is connected to the semiconductor layer 7 of the semiconductor body. The through contact 54, e.g. a metal contact, can extend from the contact layer 50 as far as the semiconductor layer 7. The through contact is expediently electrically insulated from the active region in the region of the cutout by means of an insulation material, e.g. the insulation layer 52. To allow the through contact to make contact with the semiconductor body, the insulation layer 52 can be opened.

The semiconductor bodies can be provided in a manner having such contact routing on the semiconductor body carrier, in particular the growth substrate.

The contact layers 9, 50 are electrically conductively connected to the respective connection region 104 and 106, expediently by means of a fixing layer 2 and 55, respectively. The external connection pads 15, 16 are formed on that side of the connection carrier which is remote from the semiconductor body 4, and are electrically conductively connected to the respective connection region 104, 106 in particular via connecting conductors 22 extending through the carrier body 18.

Furthermore, connection conductor layers 1, 56 of the respective connection region 104 and 106 are provided. These extend preferably laterally away from the semiconductor body and, laterally alongside the semiconductor body, are electrically conductively connected to the connection pads 15, 16, e.g. via the connecting conductors 22.

The distance between the connection pads 15, 16 is preferably greater than the distance between the contact layers 9, 50 and/or greater than the distance between the connection regions 104, 106.

The contact-connection of the device, e.g. by the connection pads being soldered to the conductor tracks of a printed circuit board, is thus simplified since the distance between the connection pads can be chosen substantially freely relative to the distance between the contact layers, which is substantially determined by the dimensioning of the semiconductor body.

By means of the methods proposed, it is possible not just for optoelectronic semiconductor bodies to be transferred in assemblage terms to a connection carrier assemblage, rather, it is also possible to fix an electronic component, e.g. for driving one or a plurality of semiconductor bodies in a device region on the connection carrier assemblage, such as, for instance, a semiconductor chip, for example a control chip and in particular an IC chip, and to electrically conductively connect it to the semiconductor body/bodies. A component assemblage comprising a plurality of separate electronic components is expediently used for this purpose. Different components can be transferred to different device regions.

FIG. 14 shows a further exemplary embodiment of an optoelectronic device 10 on the basis of two schematic plan views in FIGS. 14A and 14B. FIG. 14A shows a plan view of that side of the connection carrier 12 on which the semiconductor body 4 of the device is arranged. FIG. 14B shows a plan view of that side of the connection carrier 12 which is remote from the semiconductor body 4.

The device 10 in accordance with this exemplary embodiment substantially corresponds to the devices described in connection with the previous figures, in particular the device described in connection with FIG. 6.

The semiconductor body 4 is arranged on the connection region 104 and that side of the semiconductor body 4 which faces the connection carrier 12 is electrically conductively connected to the connection region 104 of the connection carrier 12. The connection conductor layer 1 extends away from the semiconductor body 4 as seen in a plan view of the semiconductor body 4. The connection conductor layer 1 is electrically conductively connected to the connection region 104 and/or the connecting conductor layer 1 is provided in the connection region 104. The connection conductor layer 1 is electrically conductively connected to a connection pad 15 of the connection carrier. The connection pad 15 is arranged on that side of the connection carrier 12 which faces the semiconductor body 4.

That side of the semiconductor body 4 which is remote from the connection carrier 12 is electrically conductively connected to the connection region 106 of the connection carrier. The connection region 106 can have the connection pad 16 or be electrically conductively connected to the connection region 106, for example by means of a further connection conductor layer analogously to the connection between connection pad 15 and connection region 104. The connection pad 16 is arranged on that surface (side) of the connection carrier 12 which faces the semiconductor body 4. The connection pads 15 and 16 are arranged on the same side of the connection carrier 12. The connection pads 15 and 16 are electrically conductively connected to the semiconductor body 4 on different sides of the active region (not explicitly shown in FIG. 14, cf. the figures described further above) and in particular on different sides of the semiconductor body. The connection pad 15 can be electrically conductively connected to the semiconductor body on that side of the semiconductor body 4 which faces the connection carrier 12. The connection pad 16 can be electrically conductively connected to the semiconductor body on that side of the semiconductor body 4 which is remote from the connection carrier.

The connection pads 15, 16 can be arranged at the same level.

The contact 11 extends, proceeding from that side of the semiconductor body 4 which is remote from the connection carrier 12, in the direction of the connection carrier 12 and is electrically conductively connected to the connection region 106. For this purpose, the contact conductor 24, e.g. a layer, such as a gold layer, for instance, can extend along a contact ramp, embodied in wedge-like fashion, for example, from that side of the semiconductor body 4 which is remote from the connection carrier as far as and preferably over the connection region 106. The contact ramp can be formed by the planarization layer 13. The contact ramp widens on account of the edge-side slope 25 in the direction of the connection carrier.

The contact ramp is arranged only in a partial region alongside a side area of the semiconductor body 4. In particular, the contact ramp is arranged on the connection (conductor) region 106. The contact ramp is expediently arranged between the contact conductor and the connection (conductor) region 106. The contact ramp can be embodied in electrically insulating fashion and can contain BCB, for example. The respective connection (conductor) region can contain a metal, such as gold, for example, or an alloy comprising a plurality of metals.

The current distribution structure 26 can have two frames 27a and 27b. The frame 27a runs within the frame 27b as seen in a plan view of the semiconductor body. The frames 27a, 27b can be electrically conductively connected to one another by means of the contact conductor 24. The contact conductor 24 can extend over both frames 27a and 27b. Alternatively or supplementarily, the frames and the contact conductor can have a common layer.

The connection region 104 is electrically conductively connected to a connection pad 58. The connection pad 58 is arranged on that side of the connection carrier 12 which is remote from the semiconductor body 4. The connection region 104 and thus in particular the semiconductor body can be electrically conductively connected to two connection pads 15, 58 arranged on different sides of the connection carrier.

The connection region 106 is electrically conductively connected to a connection pad 59. The connection pad 59 is arranged on that side of the connection carrier 12 which is remote from the semiconductor body 4. The connection region 106 and thus in particular the semiconductor body can be electrically conductively connected to two connection pads 16, 59 arranged on different sides of the connection carrier.

In order to electrically conductively interconnect those connection pads which are electrically conductively connected to the semiconductor body on the same side of the active region, it is possible for a (respective) connecting conductor 22 to extend from that side of the connection carrier 12 which faces the semiconductor body 4 to that side of the connection carrier which is remote from the semiconductor body 4. The connecting conductors 22 can electrically conductively connect the connection pads 15 and 58, and respectively 16 and 59, to one another. The respective connecting conductor 22 can be embodied as a connecting conductor layer, e.g. as a metal-containing layer. The (respective) connecting conductor can extend along a side surface of the connection carrier 12. The (respective) connecting conductor 22 can extend in a cutout (via) 60, preferably formed on the edge side in the connection carrier 12.

The device 10 can be contact-connected in particular as an SMD device and/or as a non-SMD device (SMD: Surface Mountable Device).

FIG. 15 shows a further exemplary embodiment of an optoelectronic device 10 on the basis of a schematic plan view. The device 10 corresponds to the device described in connection with FIG. 14. In contrast thereto, a luminescence conversion element 20 preferably localized to the semiconductor body and/or a luminescence conversion element 20 delimited to the semiconductor body, for example a luminescence conversion layer, such as a phosphor layer, for instance, is arranged on the semiconductor body 4 and in particular on the contact conductor 24 and/or the current distribution structure (in this respect, cf. the description further above).

In one preferred configuration, the (respective) semiconductor body in the context of the application, in particular the active region 5, the layer 6 and/or the layer 7, contains a III-V semiconductor material. By means of III-V compound semiconductor materials, in particular nitride compound semiconductor materials, phosphide compound semiconductor materials or arsenide compound semiconductor materials, high internal quantum efficiencies during the conversion of electrical power into radiation power can be obtained in a simplified manner during the generation of radiation. Preferably, the active region, and in particular the respective semiconductor body, is therefore based on one of the material systems mentioned.

In this connection, "based on phosphide compound semiconductors" means that the active region, in particular the semiconductor body, preferably comprises $Al_nGa_mIn_{1-n-m}P$ or consists thereof, where $0 \leq n \leq 1$, $0 \leq m \leq 1$ and $n+m \leq 1$, preferably where $n \neq 0$, $n \neq 1$, $m \neq 0$ and/or $m \neq 1$. In this case, this material need not necessarily have a mathematically exact composition according to the above formula. Rather, it can comprise one or a plurality of dopants and additional constituents which essentially do not change the physical properties of the material. For the sake of simplicity, however, the above formula only comprises the essential constituents of the crystal lattice (Al, Ga, In, P), even if these can be replaced in part by small quantities of further substances.

In this connection, "based on nitride compound semiconductors" means that the active region, in particular the semiconductor body, preferably comprises $Al_nGa_mIn_{1-n-m}N$ or consists thereof, where $0 \leq n'1$, $0 \leq m \leq 1$ and $n+m \leq 1$, preferably where $n \neq 0$, $n \neq 1$, $m \neq 0$ and/or $m \neq 1$. In this case, this material need not necessarily have a mathematically exact composition according to the above formula. Rather, it can comprise one or a plurality of dopants and additional constituents which essentially do not change the physical properties of the material. For the sake of simplicity, however, the above formula only comprises the essential constituents of the crystal lattice (Al, Ga, In, N), even if these can be replaced in part by small quantities of further substances.

In this connection, "based on arsenide compound semiconductors" means that the active region, in particular the semiconductor body, preferably comprises $Al_nGa_mIn_{1-n-m}As$ or consists thereof, where $0 \leq n \leq 1$, $0 \leq m \leq 1$ and $n+m \leq 1$, preferably where $n \neq 0$, $n \neq 1$, $m \neq 0$ and/or $m \neq 1$. In this case, this material need not necessarily have a mathematically exact composition according to the above formula. Rather, it can comprise one or a plurality of dopants and additional constituents which essentially do not change the physical properties of the material. For the sake of simplicity, however, the above formula only comprises the essential constituents of the crystal lattice (Al, Ga, In, As), even if these can be replaced in part by small quantities of further substances.

As growth substrate, e.g. sapphire, SiC or GaN growth substrates are suitable for nitride compound semiconductors, and a GaAs growth substrate, for example, is suitable for phosphide and arsenide compound semiconductors.

Preferably, the (respective) semiconductor body is embodied for generating radiation in the visible spectral range. Furthermore, the respective semiconductor body is preferably embodied for generating incoherent radiation, in particular as LED semiconductor body.

Nitride and phosphide compound semiconductor materials are particularly suitable for generating visible radiation. Arsenide compound semiconductor materials are particularly suitable for the infrared spectral range. In this case, nitride compound semiconductor materials are particularly suitable for generating radiation from the ultraviolet through the blue to the green spectral range and phosphide compound semiconductor materials are particularly suitable for radiation from the orange to the red spectral range.

The present patent application claims the priority of the German Patent Application DE 10 2007 030 129.6 of Jun. 29, 2007, the entire disclosure content of which is hereby explicitly incorporated by reference in the present patent application.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. A method for producing a plurality of optoelectronic devices comprising the steps of:

providing a connection carrier assemblage having a plurality of device regions, wherein at least one electrical connection region is provided in each of the device regions;

providing a semiconductor body carrier, on which a plurality of separate semiconductor bodies connected to the semiconductor body carrier are arranged, wherein the semiconductor bodies each have a semiconductor layer sequence having an active region;

arranging the connection carrier assemblage and the semiconductor body carrier relative to one another in such a way that the semiconductor bodies face the device regions;

mechanically connecting a plurality of semiconductor bodies to the connection carrier assemblage, the respective semiconductor body being mechanically connected to the connection carrier assemblage in a mounting region of one of the device regions which is assigned to the respective semiconductor body, electrically conductively connecting the respective semiconductor body to the connection region of the device region assigned to the semiconductor body, and separating from the semiconductor body carrier the semiconductor bodies that are to be connected or are connected to the connection carrier assemblage; and dividing the connection carrier assemblage into a plurality of separate optoelectronic devices each having a connection carrier, which has the device region, and a semiconductor body arranged on the connection carrier and electrically conductively connected to the connection region, wherein a contact conductor is formed which, in the respective optoelectronic device, extends from that side of the respective semiconductor body which is remote from the mounting region toward the connection carrier, and wherein, after the semiconductor bodies have been fixed on the connection carrier assemblage, a contact is applied to that side of the respective semiconductor body which is remote from the mounting region, wherein the contact has a current distribution structure, which is applied to that side of the semiconductor body which is remote from the mounting region of the semiconductor body, and the contact conductor and the current distribution structure are applied to the connection carrier assemblage by means of lithography using a common mask.

2. The method as claimed in claim 1, wherein the respective connection region has the mounting region and a connection conductor region and the mounting region rises above the connection conductor region.

3. The method as claimed in claim 1, wherein the connection carrier is transmissive to radiation generated in the semiconductor body.

4. The method as claimed in claim 1, wherein the connection regions of the connection carrier assemblage are formed by means of lithography.

5. The method as claimed in claim 1, wherein, in a device region, a plurality of semiconductor bodies are connected to the connection carrier assemblage and a distance between adjacent semiconductor bodies in the device region is 40 μm or less.

6. The method as claimed in claim 1, wherein, after the semiconductor bodies have been fixed on the connection carrier assemblage, a planarization material is applied between the semiconductor bodies onto the connection carrier assemblage and the planarization material is formed in such a way that a planarization layer is arranged alongside the respective semiconductor body.

7. The method as claimed in claim 1,
wherein the semiconductor body carrier is removed after the semiconductor bodies have been separated from the semiconductor body carrier, and a further semiconductor body carrier is provided,
wherein semiconductor bodies arranged on the further semiconductor body carrier are connected to the connection carrier assemblage and separated from the further semiconductor body carrier, and
wherein further semiconductor bodies arranged on the further semiconductor body carrier are in each case fixed on at least one of the semiconductor bodies that has already been connected to the connection carrier assemblage, and in particular electrically conductively connected to the latter at least one semiconductor body.

8. An optoelectronic device comprising:
a semiconductor body comprising a semiconductor layer sequence having an active region;
a connection carrier, on which the semiconductor body is arranged and fixed, wherein an electrical connection region is formed on that side of the connection carrier which faces the semiconductor body, the connection region extends alongside the semiconductor body in a plan view of the connection carrier and the connection region is electrically conductively connected to the semiconductor body;
a planarization layer arranged alongside the semiconductor body on the connection carrier, wherein a distance between that side of the planarization layer which is remote from the connection carrier and that side of the semiconductor body which is remote from the connection carrier is less than a distance between that side of the semiconductor body which is remote from the connection carrier and the connection carrier; and
an electrical contact on that side of the semiconductor body which is remote from the connection carrier, the electrical contact extending over that side of the planarization layer which is remote from the connection carrier, the electrical contact comprising a contact conductor which extends from that side of the semiconductor body which is remote from the mounting region towards the connection carrier, the electrical contact comprising a current distribution structure which is arranged on that side of the semiconductor body which is remote from the connection carrier, the current distribution structure and the contact conductor having a continuous layer.

9. The device as claimed in claim 8, wherein the planarization layer runs on a side remote from the semiconductor body obliquely to the connection carrier and the contact conductor extends along the slope.

10. The device as claimed in claim 8, wherein at least one external connection pad of the device is arranged on that side of the connection carrier which is remote from the semiconductor body, and the connection carrier is cut out for the electrically conductive linking of the connection pad to the semiconductor body.

11. The device as claimed in claim 8, wherein the semiconductor body has a thickness of 10 μm or less.

12. The device as claimed in claim 8, which has a plurality of semiconductor bodies, wherein the active regions of two semiconductor bodies are formed for generating radiation in different-colored spectral ranges.

13. The device as claimed in claim 8, wherein the planarization layer forms a contact ramp.

14. The method as claimed in claim 1, wherein, after the semiconductor bodies have been fixed on the connection carrier assemblage, a planarization material is applied between the semiconductor bodies onto the connection carrier assemblage and the planarization material, after being applied, is formed in such a way that a planarization layer is arranged alongside the respective semiconductor body so as to form the contact ramp.

15. The method as claimed in claim 1, wherein the contact conductor is formed in layer-like fashion.

16. The method as claimed in claim 1, wherein the contact is applied before the connection carrier assemblage is divided.

17. The method as claimed in claim 1, further comprising providing a contact ramp alongside the semiconductor body, the contact ramp, in the respective device, running in the direction of that side of the connection carrier which faces the semiconductor body.

* * * * *